United States Patent
Feng et al.

(10) Patent No.: US 12,419,135 B2
(45) Date of Patent: Sep. 16, 2025

(54) N-TYPE TOPCON CELL WITH DOUBLE-SIDED ALUMINUM PASTE ELECTRODES, AND PREPARATION METHOD FOR PREPARING N-TYPE TOPCON CELL WITH DOUBLE-SIDED ALUMINUM PASTE ELECTRODES

(71) Applicant: CHINT NEW ENERGY TECHNOLOGY CO., LTD., Zhejiang (CN)

(72) Inventors: Mingzhang Feng, Zhejiang (CN); Sheng He, Zhejiang (CN); Wei-Chih Hsu, Zhejiang (CN)

(73) Assignee: CHINT NEW ENERGY TECHNOLOGY CO., LTD., Zhejiang (CN)

( * ) Notice: Subject to any disclaimer, the term of this patent is extended or adjusted under 35 U.S.C. 154(b) by 0 days.

(21) Appl. No.: 18/038,704

(22) PCT Filed: May 25, 2021

(86) PCT No.: PCT/CN2021/095755
§ 371 (c)(1),
(2) Date: May 24, 2023

(87) PCT Pub. No.: WO2022/183603
PCT Pub. Date: Sep. 9, 2022

(65) Prior Publication Data
US 2024/0097057 A1    Mar. 21, 2024

(30) Foreign Application Priority Data
Mar. 5, 2021   (CN) .......................... 202110242438.0

(51) Int. Cl.
*H10F 77/20* (2025.01)
*H10F 71/00* (2025.01)
(Continued)

(52) U.S. Cl.
CPC ......... *H10F 77/211* (2025.01); *H10F 71/129* (2025.01); *H10F 77/215* (2025.01); *H10F 77/311* (2025.01); *H10F 77/703* (2025.01)

(58) Field of Classification Search
None
See application file for complete search history.

(56) References Cited

U.S. PATENT DOCUMENTS

2021/0111294 A1*  4/2021  Lin ..................... H01L 31/0288

FOREIGN PATENT DOCUMENTS

| CN | 106910783 8 | 6/2017 |
| CN | 106981524 7 | 7/2017 |

(Continued)

OTHER PUBLICATIONS

The extended European report of the corresponding EP application No. 21928684.6, mail date Apr. 8, 2024.

*Primary Examiner* — Ryan S Cannon
(74) *Attorney, Agent, or Firm* — The Sun IP Law (57) ABSTRACT

Some embodiments of the present disclosure provide an N-type TOPCon cell with double-sided aluminum paste electrodes, and a preparation method therefor. The front side of the cell is provided with a front-side silver main grid and a front-side aluminum fine grid, and the back side is provided with a back-side silver main grid and a back-side aluminum fine grid. The method for preparing the cell includes: texturing→B diffusion→BSG removal→alkali polishing→depositing a tunnel oxide layer and a polysilicon layer on a back side of a substrate by means of LPCVD→P diffusion on the back side→PSG removal→plating removal→deposition of an $AlO_x$ preparatory layer and a first $SiN_xH_y$ preparatory layer on the front side→deposition of a second preparatory layer $SiN_xH_y$ on the back side→UV laser (Continued)

ablation on the front side of the substrate and the back side of the substrate→screen printing.

14 Claims, 3 Drawing Sheets (51) Int. Cl.
*H10F 77/30* (2025.01)
*H10F 77/70* (2025.01)

(56) References Cited

FOREIGN PATENT DOCUMENTS

| | | |
|---|---|---|
| CN | 107968127 A | 4/2018 |
| CN | 110289333 A | 9/2019 |
| CN | 110660883 | 1/2020 |
| CN | 111628047 A | 9/2020 |
| CN | 111640825 A | 9/2020 |
| CN | 112103364 A | 12/2020 |
| CN | 112599615 A | 4/2021 |
| EP | 3783668 A1 | 2/2021 |
| TW | M606270 /5 | 1/2021 |

* cited by examiner

N-TYPE TOPCON CELL WITH DOUBLE-SIDED ALUMINUM PASTE ELECTRODES, AND PREPARATION METHOD FOR PREPARING N-TYPE TOPCON CELL WITH DOUBLE-SIDED ALUMINUM PASTE ELECTRODES

CROSS-REFERENCE TO RELATED APPLICATIONS

The present disclosure is a national stage application of International Patent Application No. PCT/CN2021/095755, which is filed on May 25, 2021, and claims priority to Chinese Patent Application No. 202110242438.0, filed on Mar. 5, 2021 and entitled "N-Type TOPCon Cell with Double-Sided Aluminum Paste Electrodes, and Preparation Method for Preparing N-Type TOPCon Cell with Double-Sided Aluminum Paste Electrodes", the contents of which are hereby incorporated by reference in its entirety.

TECHNICAL FIELD

The present disclosure relates to a technical field of solar cells, and in particular, to an N-type TOPCon cell with double-sided aluminum paste electrodes, and a preparation method for preparing the N-type TOPCon cell with the double-sided aluminum paste electrodes.

BACKGROUND

A TOPCon solar cell (Tunnel Oxide Passivated Contact) is a solar cell, which uses an ultra-thin oxide layer as a passivation layer structure. An N-type TOPCon cell is structured with an N-type Si substrate, a P+ doped layer is obtained on the front side by means of B-diffusion, and a corresponding $AlO_x/SiN_x$ passivation dielectric film is deposited on the front side by means of Atomic Layer Deposition (ALD) or Plasma Enhanced Chemical Vapor Deposition (PECVD). A tunnel oxide layer and polysilicon are deposited on the back side by means of Low Pressure Chemical Vapor Deposition (LPCVD), and an N+ doped layer is obtained by means of in-situ P doping or intrinsic P diffusion. Corresponding metal electrodes are usually obtained on the front and back sides by means of screen printing. Silver aluminum paste is used on the front side, and silver paste is used on the back side. On the one hand, compared with a P-type Passivated Emitter and Rear Cell (PERC) cell, the silver paste is used on the back side of the N-type TOPCon cell. Although a higher double-sided ratio can be ensured, the manufacturing cost of the cell is increased at the same time, such that, in order to meet the principle of efficiency improvement and cost reduction of the N-type TOPCon cell, the use of the silver paste on the back side should be reduced as much as possible. On the other hand, the use of the silver paste on the front side of the cell should also be reduced as much as possible in order to have an absolute advantage over a PERC cell in terms of cost and efficiency.

For example, "A Method for Manufacturing N-Type TOPCon Solar Cell" with the Patent No. of CN202010483586.7 relates to a method for manufacturing an n-type TOPCon solar cell. The method includes the following steps: a, double-sided texturing; b, single-sided spin coating; c, single-sided oxidation: forming a boron-containing silicon oxide layer on a spin coating face; d, formation of heavily and lightly doped region substrates: using a masking mode to form, at a position corresponding to a metal grid line, an organic mask layer protecting a heavily doped region; and using HF to completely removing the boron-containing silicon oxide layer and a boron source outside a coverage region of the organic mask layer, and then removing the organic mask layer; and e, completion of heavy and light doping: using a tubular low pressure diffusion method to completely push the spin-coated boron source into a silicon substrate, so as to form the heavily doped region; then performing whole surface through-source deposition, to form a lightly doped region; finally, performing high-temperature oxidation to form a Borosilicate Glass (BSG) layer with the thickness being 80-100 nm; and then performing normal subsequent processes.

The disadvantages of the above method lie in that, only a silver grid is used as a transmission medium, such that the photoelectric conversion efficiency of a cell is low.

SUMMARY

Some embodiments of the present disclosure provide an N-type TOPCon cell with double-sided aluminum paste electrodes, and a preparation method for preparing an N-type TOPCon cell with double-sided aluminum paste electrodes, to overcome the problems of high cost and low photoelectric conversion efficiency of an electrode of an N-type TOPCon cell. In the present invention, aluminum grid lines and segmented silver main grids are obtained on a front side of the substrate and a back side of the substrate by means of aluminum paste printing. By means of adjusting the components of glass powder in aluminum paste, a desirable ohmic contact is only formed between the aluminum paste and a N-type doped polysilicon layer, without forming a BSF layer, such that on the back side of the substrate, silver paste is replaced with aluminum paste, so as to form a desirable field passivation effect is formed, thereby increasing a diffusion length of carriers, enhancing the Voc of a cell, and reducing the manufacturing cost of the cell.

In order to implement the above objective, the present disclosure uses the following technical solutions.

Some embodiments of the present disclosure provide an N-type TOPCon cell with double-sided aluminum paste electrodes includes an N-type substrate. A P-type doped region layer, an $AlO_x$ layer and a first $SiN_xH_y$ layer are successively provided, from inside to outside, on a front side of the N-type substrate; a tunnel oxide layer, an N-type doped polysilicon layer and a second $SiN_xH_y$ layer are successively provided, from inside to outside, on a back side of the N-type substrate; front-side silver main grids and front-side aluminum fine grids are provided on the first $SiN_xH_y$ layer, and back-side silver main grids and back-side aluminum fine grids are provided on the second $SiN_xH_y$ layer.

Some embodiments of the present disclosure provide a method for preparing the N-type TOPCon cell with double-sided aluminum paste electrodes includes: texturing→B diffusion→BSG removal→alkali polishing→depositing a tunnel oxide layer and a polysilicon layer on a back side of a substrate by means of LPCVD→P diffusion on the back side of the substrate→PSG removal→plating removal→deposition of an $AlO_x$ preparatory layer and a first $SiN_xH_y$ preparatory layer on a front side of the substrate→deposition of a second $SiN_xH_y$ preparatory layer on the back side of the substrate→UV laser ablation on the front side of the substrate and the back side of the substrate→screen printing.

In the N-type TOPCon cell, aluminum paste and a small amount of silver paste are respectively used on a front side of the substrate, so as to prepare aluminum fine grids and segmented silver main grids. The aluminum fine grids gather collected currents to the silver main grids, and the silver main grids meet a soldering requirement. The aluminum paste and a small amount of silver paste are respectively used on the back side of the substrate, so as to form the aluminum fine grids and the segmented silver main grids. The aluminum fine grids gather the collected currents to the silver main grids, and the silver main grids meet the soldering requirement. According to the method, on the one hand, the consumption of the front side of the substrate and the back-side silver paste may be reduced, such that costs are reduced; and on the other hand, the Voc (Volatile Organic Compounds) of the cell is improved by reducing laser damage, forming a front surface field on the front surface and reducing metal compounding, such that the efficiency of the cell is superior to the efficiency of a double-sided silver paste cell.

In some embodiments, the present disclosure specifically includes the following steps.

At step A, namely the step of preparation of an N-type double-sided cell before metallization: an N-type monocrystalline silicon wafer is used as the substrate, the P-type doped region layer is formed on a front side of the N-type monocrystalline silicon wafer successively by means of B diffusion, the $AlO_x$ preparatory layer and the first $SiN_xH_y$ preparatory layer are deposited by means of PECVD, the tunnel oxide layer and the polysilicon layer on a back side of the N-type monocrystalline silicon wafer by means of LPCVD, forming the N-type doped polysilicon layer by means of P diffusion, and depositing the second $SiN_xH_y$ preparatory layer by means of PECVD.

At step B, UV laser ablation on a front surface of a preparatory cell prepared by a step A to remove part of passivation dielectric film of the $AlO_x$ preparatory layer and the first $SiN_xH_y$ preparatory layer; and performing UV laser ablation on a back side of the cell prepared by the step A to remove part of passivation dielectric film of the second $SiN_xH_y$ preparatory layer.

At step C, aluminum paste to print and sinter a front surface of a preparatory cell prepared by a step B, so as to form a local contact point H-type front-side aluminum fine grid line electrode, wherein each of the front-side silver main grids is designed in a first segmented structure, the first segmented structure include a plurality of first grid segments, and the front-side silver main grids are distributed in aluminum fine grid lines; a number of the front-side aluminum fine grids is 106-122, each of the front-side aluminum fine grids has a width being 25-40 um and a height being 10-25 um; and each of the plurality of first grid segments of the front-side silver main grids has a length of 2-8 mm, a width of 0.1-2 mm and a height of 4-8 um, and a number of the front-side silver main grids is 5-12.

At step D, weak burn-through type aluminum paste to print and sinter the back side of the preparatory cell prepared by the step B or the step A, so as to form a local contact point H-type back-side aluminum fine grid line electrode, wherein a number of the back-side aluminum fine grids is 110-160, each of the back-side aluminum fine grids has a width being 40-160 um and a height being 10-25 um; and each of the back-side silver main grids are designed in a second segmented structure, and the second segmented structure includes a plurality of second grid segments; each of the plurality of second grid segments has a length of 2-8 mm, a width of 0.1-2 mm and a height of 4-8 um, and a number of the back-side silver main grids is 5-12.

In the related art known to inventors, in order to reduce the cost of back-side metallization, some current researchers use a method for metallizing the back side of a P-type PERC cell. That is to say, a passivation dielectric film is partially removed from the back side of a P-type PERC cell by means of laser ablation, then aluminum paste is printed, and a metal electrode in an ohmic contact is formed by means of sintering. In the method for metallizing the back side of a P-type PERC cell, using existing green-light laser ablation produces a large laser spot and an edge crater, resulting in too much damage to the passivation dielectric film and a lower passivation effect, thus affecting the Voc of the cell, and reducing the efficiency of the cell.

Compared with an existing preparation process, some embodiments of the present disclosure provide the N-type TOPCon cell, part of passivation dielectric film of the $AlO_x$ preparatory layer and the first $SiN_xH_y$ preparatory layer from the front side of the substrate by means of UV laser ablation without damaging a PN junction, and part of the second $SiN_xH_y$ preparatory layer passivation film is removed from the back side of the substrate by means of a UV laser without damaging the N-type doped polysilicon layer. The advantages of the front side of the substrate and the back-side metal electrode in the present disclosure are as follows. (1) UV laser ablation is used to remove part of passivation dielectric film of the $AlO_x$ preparatory layer and the first $SiN_xH_y$ preparatory layer from the front side of the substrate; and compared with green-light laser ablation, the diameter of the spot is small, and there is virtually no ablation crater on the edge, such that damage to the passivation dielectric film and a cell PN junction region is reduced to the maximum extent; (2) UV laser ablation is used to remove part of passivation dielectric film of the second $SiN_xH_y$ preparatory layer from the back side of the substrate; compared with green-light laser ablation, the diameter of the spot is small, and there is virtually no ablation crater on the edge, such that damage of green-light laser ablation to the passivation dielectric film is reduced to the maximum extent, and the releasing of energy can be accurately controlled, thereby ensuring that the N-type doped polysilicon layer is not damaged; and (3) by means of using the method to manufacture the front side of the substrate and the back-side of the substrate metal electrode, the efficiency can be guaranteed to be comparable to that of a double-sided silver paste metal electrode, but the manufacturing cost is drastically reduced.

In some embodiments, in step A, a thickness of the $AlO_x$ preparatory layer on the front side of the N-type substrate is 2-15 nm; a thickness of the first $SiN_xH_y$ preparatory layer on the front side of the N-type substrate is 50-100 nm; a thickness of the tunnel oxide layer on the back side of the N-type substrate is 1-8 nm; a thickness of the N-type doped polysilicon layer on the back side of the N-type substrate is 100-200 nm; and the thickness of the second $SiN_xH_y$ preparatory layer on the back side of the N-type substrate is 50-100 nm.

The $AlO_x$ preparatory layer on the front side of the N-type substrate and the first $SiN_xH_y$ preparatory layer increase a front side of the N-type substrate passivation effect and decrease the reflectivity of the front surface; a tunnel oxide layer on the back side of the N-type substrate is selective passivation for carriers; the N-type doped polysilicon is mainly to reduce contact resistance with the back-side electrode; and the second $SiN_xH_y$ preparatory layer increases a back side of the N-type substrate passivation effect. The thickness range is set because the thicknesses of different film layers need to be both optically and electrically balanced to maximize the photovoltaic conversion efficiency.

In some embodiments, in step B, a spot diameter of a UV laser is 10-30 um, and a space between two adjacent spots of the UV laser is 0-700 um; a front-side ablation film-removing depth is consistent with thicknesses of the $AlO_x$ preparatory layer and the first $SiN_xH_y$ preparatory layer; and a back-side ablation film-removing depth is consistent with a thickness of the passivation dielectric film of the second $SiN_xH_y$ layer on the back side of the N-type substrate.

In order to ensure adequate and timely collection and transport of carriers, front side of the substrate and the back-side of the substrate ablation film-removing depth must be consistent with a thickness of the passivation film layer, such that the front-side aluminum fine grid can be in full contact with a P-type doped region layer, and the back-side aluminum fine grid can be in full contact with the N-type doped polysilicon layer, so as to further improve the photoelectric conversion efficiency of the cell.

In some embodiments, in step D, a back-side aluminum fine grid formed on the back side of the N-type substrate by means of sintering forms an ohmic contact with the N-type doped polysilicon layer, without forming a BSF layer.

The back-side aluminum fine grid only forms the ohmic contact with the N-type doped polysilicon layer, such that the aluminum paste does not continuously penetrate the doped polysilicon layer to enter an Si substrate, so as to form secondary doping, and therefore, the BSF layer is not formed.

An N-type TOPCon cell with double-sided aluminum paste electrodes and prepared by the preparation method, a thickness of each of the front-side silver main grids is less than a thickness of each of the front-side aluminum fine grids, and the front-side silver main grids are distributed in the front-side aluminum fine grids; and a thickness of each of the back-side silver main grids is less than a thickness of each of the back-side aluminum fine grids, and the back-side silver main grids are distributed in the back-side aluminum fine grids.

Since the silver main grids are first printed, and then the aluminum fine grids are printed, the silver main grids and the aluminum fine grids need an overlapping part to gather the carriers collected by the aluminum fine grids to the silver main grids, such that in terms of height, the silver main grids are lower than the aluminum fine grids. Such design does not affect the soldering effect of the silver main grid, thus improving the flow efficiency of the carriers. In addition, for a surface structure of the cell, a soldering structure of the silver main grids is prevented from protruding, the surface structure is flatter; and the cell is small in size, such that a mounting space is saved.

In some embodiments, first contact grooves are provided on the $AlO_x$ layer and the first $SiN_xH_y$ layer on the front side of the N-type substrate; and second contact grooves are provided on the second $SiN_xH_y$ layer on the back side of the N-type substrate.

In some embodiments, the front-side aluminum fine grids pass through the first contact grooves to form first local contact points with the $AlO_x$ layer.

In some embodiments, the back-side aluminum fine grids pass through the second contact grooves to form second local contact points with the N-type doped polysilicon layer.

Generally, a back-side metal electrode of a N-type TOPCon cell is directly prepared by means of silver paste printing, and a front-side metal electrode is prepared by means of silver aluminum paste. Compared with a P-type PERC cell being high in manufacturing cost, an efficiency advantage cannot be highlighted, that is, the manufacturing cost of the solar cell per watt cannot be significantly reduced. For the use of the front-side silver paste of the N-type TOPCon cell, some researchers first print the aluminum fine grid and then overprint the silver fine grid on the aluminum fine grid to reduce the use of the front-side silver paste. Although a method of the use of the front-side silver paste of the N-type TOPCon cell reduces the consumption of the front-side silver paste to a certain extent and reduces the manufacturing cost of the cell, in order to meet a sintering condition of upper-layer silver paste of a front side of a prepared cell, a sintering temperature is too high, resulting in the enhancement of lateral and vertical expansion of lower-layer aluminum paste of the front side of a prepared cell, the passivation effect of the front side of a prepared cell is reduced, and a light-shading area is increased, such that the efficiency of the cell cannot reach an expected target. Therefore, UV laser ablation is performed on the front side of the prepared cell to remove part of passivation film of the $AlO_x$ preparatory layer and the first $SiN_xH_y$ preparatory layer, and then the fine grid lines and segmented silver main grids are obtained by printing the aluminum paste and a small amount of the silver paste; and UV laser ablation is also performed on a back side of the prepared cell to remove part of passivation film of the second $SiN_xH_y$ preparatory layer. Since the N-doped polysilicon layer is not damaged by means of reference control of a laser, and then the fine grid lines and the segmented silver main grids are obtained by respectively printing the aluminum paste and the small amount of silver paste, the N-type TOPCon cell with double-sided aluminum paste electrodes of the present disclosure has the following advantages. (1) The front side of the substrate is directly printed by using the aluminum paste, so as to obtain the aluminum grid lines; on the one hand, the N-type doped polysilicon layer is formed on the front side of the substrate, so as to form a desirable field passivation effect, such that the diffusion length of carriers is increased, and the Voc of a cell is enhanced; and on the other hand, the manufacturing cost of the front-side the substrate electrode is greatly reduced; (2) the back side of the substrate is directly printed by using the aluminum paste, so as to obtain the aluminum grid lines; by means of adjusting the components of glass powder in slurry, a desirable ohmic contact is only formed between the slurry and a doped N-type doped polysilicon layer, without forming a BSF layer, such that on the back side of the substrate, silver paste is replaced with aluminum paste, thereby reducing the manufacturing cost of the back-side of the substrate electrode; and (3) the electrodes are manufactured on the front side of the substrate and the back side of the substrate by using the aluminum paste, such that deep energy level impurity Ag of Si is prevented from entering to cause excessive metal compounding, that is, excessive $J_{0,metal}$, thereby enhancing the Voc and conversion efficiency of the N-type TOPCon cell.

Therefore, the present disclosure has the following beneficial effects.

(1) By means of preparing the aluminum fine grids and the segmented silver main grids on a front side of the N-type TOPCon cell and the back side of the N-type TOPCon cell by using the aluminum paste and the small amount of silver paste, the aluminum fine grids gather collected currents to the silver main grids, and the silver main grids meet a soldering requirement.

(2) During processing, UV laser ablation is used to remove part of passivation dielectric film of the preparatory $AlO_x$ layer and the first $SiN_xH_y$ preparatory layer from the front side of the substrate; and compared with green-light laser ablation, the diameter of the spot is small, and there is virtually no ablation crater on the edge, such that damage to the passivation dielectric film and a cell PN junction region is reduced to the maximum extent, and damage to the surface coating of the cell is reduced.

(3) By means of the N-type TOPCon cell structure, on the one hand, the consumption of the front side of the substrate and the back side of the substrate silver paste is reduced, such that costs are reduced; and on the other hand, the Voc of the cell is improved by reducing laser damage, forming a front surface field on the front side of the substrate and reducing metal compounding, such that the efficiency of the cell is superior to the efficiency of a double-sided silver paste cell.

In the drawings: 1, N-type substrate; 2, Front-side silver main grid; 3, Front-side aluminum fine grid; 4, Back-side silver main grid; 5, Back-side aluminum fine grid; 6, P-type doped region layer; 7, $AlO_x$ layer; 8, $SiN_xH_y$ layer; 81, first $SiN_xH_y$ layer; 82, second $SiN_xH_y$ layer; 9, Tunnel oxide layer; 10, N-type doped polysilicon layer; 11, Local contact point; 111, first local contact points; 112, second local contact points.

DETAILED DESCRIPTION OF THE EMBODIMENTS

The present disclosure is further described below with reference to specific implementations.

General Embodiment

Figure 1:
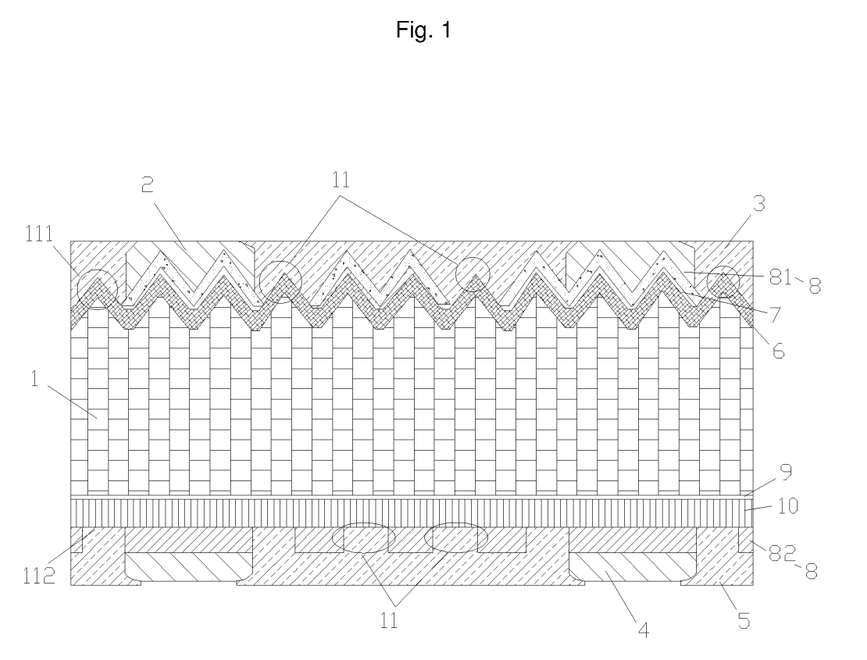
FIG. 1 illustrates a schematic diagram of a cell structure according to some embodiments of the present disclosure.
Figure 2:
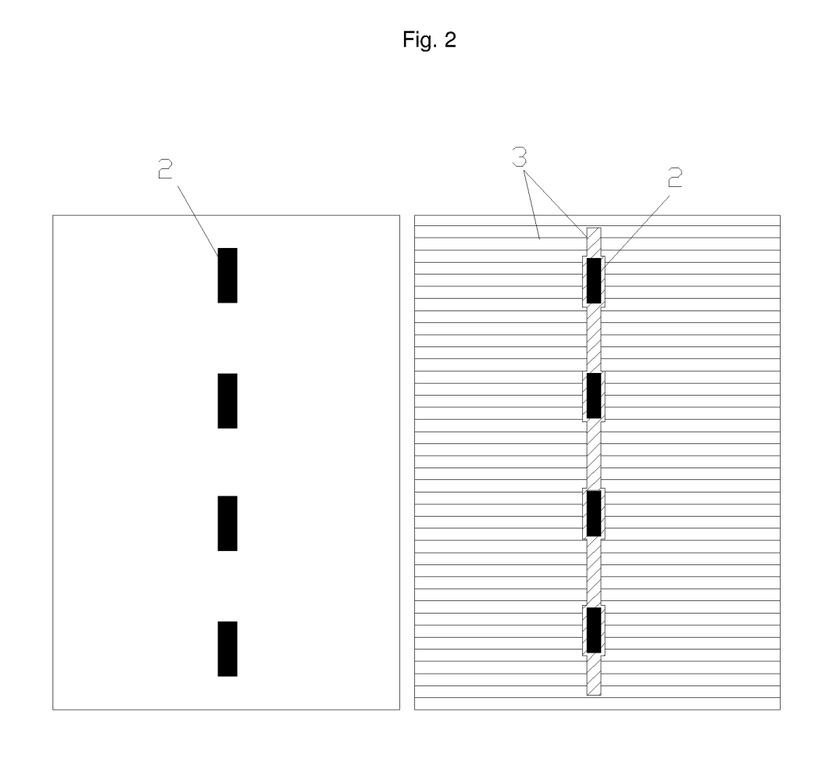
FIG. 2 illustrates a schematic structural diagram of front-side grid lines of a cell according to some embodiments of the present disclosure.
Figure 3:
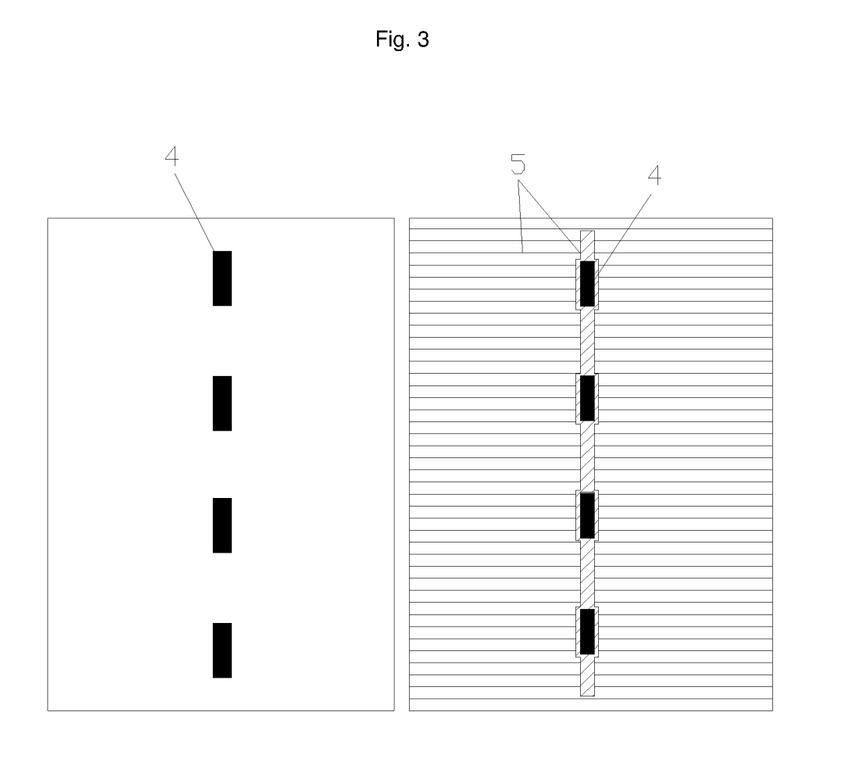
FIG. 3 illustrates a schematic structural diagram of back-side grid lines of a cell according to some embodiments of the present disclosure.

As shown in FIGS. 1-3, an N-type TOPCon cell with double-sided aluminum paste electrodes includes an N-type substrate 1. A P-type doped region layer 6, an $AlO_x$ layer 7 and a first $SiN_xH_y$ layer 81 are successively provided, from inside to outside, on a front side of the N-type substrate 1; a tunnel oxide layer 9, an N-type doped polysilicon layer 10 and a second $SiN_xH_y$ layer 82 are successively provided, from inside to outside, on a back side of the N-type substrate 1; front-side silver main grids 2 and front-side aluminum fine grids 3 are provided on the first $SiN_xH_y$ layer 81, and back-side silver main grids 4 and back-side aluminum fine grids 5 are provided on the second $SiN_xH_y$ layer 82.

A thickness of each of the front-side silver main grids 2 is less than a thickness of each of the front-side aluminum fine grids 3, and the front-side silver main grids 2 are distributed in the front-side aluminum fine grids 3; and a thickness of each of the back-side silver main grids 4 is less than a thickness of each of the back-side aluminum fine grids 5, and the back-side silver main grids 4 are distributed in the back-side aluminum fine grids 5. First contact grooves are provided on the $AlO_x$ layer 7 and the first $SiN_xH_y$ layer 81 on the front side of the N-type substrate 1; and second contact grooves are provided on the second $SiN_xH_y$ layer 82 on the back side of the N-type substrate 1. The front-side aluminum fine grids 3 pass through the first contact grooves to form first local contact points 111 with the $AlO_x$ layer 7. The back-side aluminum fine grids 5 pass through the second contact grooves to form second local contact points 112 with the N-type doped polysilicon layer 10.

A method for preparing the N-type TOPCon cell with double-sided aluminum paste electrodes includes the following processes: texturing→B diffusion→BSG removal→alkali polishing→depositing a tunnel oxide layer and a polysilicon layer on a back side of a substrate by means of LPCVD→P diffusion on the back side of the substrate→PSG removal→plating removal→deposition of an $AlO_x$ preparatory layer and a first $SiN_xH_y$ preparatory layer on a front side of the substrate→deposition of a second $SiN_xH_y$ preparatory layer on the back side of the substrate→UV laser ablation on the front side of the substrate and the back side of the substrate→screen printing. The method includes the following specific preparation steps.

At step A, namely the step of preparation of an N-type double-sided cell before metallization: an N-type monocrystalline silicon wafer as the substrate, the P-type doped region layer is formed on a front side of the N-type monocrystalline silicon wafer successively by means of B diffusion, the $AlO_x$ preparatory layer on the front side of the N-type substrate 1 with the thickness of 2-15 nm and the first $SiN_xH_y$ preparatory layer on the front side of the N-type substrate 1 with the thickness of 50-100 nm are deposited by means of PECVD, a tunnel oxide layer on the back side of the N-type substrate 1 with the thickness of 1-8 mm is deposited on a back side of the N-type silicon wafer by means of LPCVD; and the N-type doped polysilicon layer on the back side of the N-type substrate 1 with a thickness of 100-200 nm is formed by means of LPCVD and P diffusion; and the second $SiN_xH_y$ preparatory layer on the back side of the N-type substrate 1 with a thickness of 50-100 nm is deposited by means of PECVD.

A preparation cell before metallization means before the screen printing of a method for preparing the N-type TOPCon cell with double-sided aluminum paste electrodes.

At step B, UV laser ablation is performed on a front surface of a preparatory cell prepared by a step A to remove part of passivation dielectric film of the $AlO_x$ preparatory layer and the first $SiN_xH_y$ preparatory layer; and UV laser ablation is performed on a back side of the cell prepared by the step A to remove part of passivation dielectric film of the second $SiN_xH_y$ preparatory layer. A spot diameter of a UV laser is 10-30 um, and a space between two adjacent of spots of the UV laser is 0-700 um; a front-side ablation film-removing depth is consistent with thicknesses of the $AlO_x$ preparatory layer and the first $SiN_xH_y$ preparatory layer; and a back-side ablation film-removing depth is consistent with a thickness of the passivation dielectric film of the second $SiN_xH_y$ layer 82 on the back side of the N-type substrate 1.

At step C, aluminum paste (Al 60-80 wt %, Si≤40 wt %, glass powder≤5 wt %, and resin≤5 wt %; and an organic solvent is added to the aluminum paste adjust viscosity to be 20-25 Pa·s) is used to print and sinter the front surface of the cell by the step B, so as to form a local contact point H-type front-side aluminum fine grids line electrode, where each of a front-side silver main grids are designed in a first segmented structure, the first segmented structure includes a plurality of first grid segments, and each of a front-side silver main grids is distributed in aluminum fine grid lines; a number of the front-side aluminum fine grids is 106-122, each of the front-side aluminum fine grids has a width being 25-40 um and each of the front-side aluminum fine grids has a height being 10-25 um; and each of the plurality of first grid segments of the front-side silver main grids has a length of 2-8 mm, a width of 0.1-2 mm and a height of 4-8 um, and a number of the front-side silver main grids is 5-12.

At step D, weak burn-through type aluminum paste (Al 60-80 wt %, Si≤40 wt %, glass powder≤5 wt %, and resin≤5 wt %; and the organic solvent is added to the weak burn-through type aluminum paste adjust the viscosity to be 20-25 Pa·s) is used to print and sinter a back side of the cell by the step B or step C, so as to form a local contact point H-type back-side aluminum fine grids line electrode, where a number of the back-side aluminum fine grids is 110-160, with each of the back-side aluminum fine grids has a width being 40-160 um and each of the back-side aluminum fine grids the height being 10-25 um; and each of the back-side silver main grids are designed in a second segmented structure, and the second segmented structure includes a plurality of second grid segments; each of the plurality of second grid segments has a length of 2-8 mm, a width of 0.1-2 mm and a height of 4-8 um, and a number of the back-side silver main grids is 5-12. The aluminum fine grids formed on the back side by means of sintering forms an ohmic contact with the N-type doped polysilicon layer, without forming a BSF layer.

Embodiment 1

As shown in FIG. 1, an N-type TOPCon cell with double-sided aluminum paste electrodes includes an N-type substrate 1. A P-type doped region layer 6, an $AlO_x$ layer 7 and a first $SiN_xH_y$ layer 81 are successively provided, from inside to outside, on a front side of the N-type substrate 1; a tunnel oxide layer 9, an N-type doped polysilicon layer 10 and a second $SiN_xH_y$ layer 82 are successively provided, from inside to outside, on a back side of the N-type substrate 1; as shown in FIG. 2, front-side silver main grids 2 and front-side aluminum fine grids 3 are provided on the first $SiN_xH_y$ layer 81; and as shown in FIG. 3, back-side silver main grids 4 and back-side aluminum fine grids 5 are provided on the second $SiN_xH_y$ layer 82.

A thickness of each of the front-side silver main grids 2 is less than a thickness of each of the front-side aluminum fine grids 3, and the front-side silver main grids 2 are distributed in the front-side aluminum fine grids 3; and a thickness of each of the back-side silver main grids 4 is less than a thickness of each of the back-side aluminum fine grids 5, and the back-side silver main grids 4 are distributed in the back-side aluminum fine grids 5. First contact grooves are provided on the $AlO_x$ layer 7 and the first $SiN_xH_y$ layer 81 on the front side of the N-type substrate 1; and second contact grooves are provided on the second $SiN_xH_y$ layer 82 on the back side of the N-type substrate 1. The front-side aluminum fine grids 3 pass through the first contact grooves to form first local contact points 111 with the $AlO_x$ layer 7. The back-side aluminum fine grids 5 pass through the second contact grooves to form second local contact points 112 with the N-type doped polysilicon layer 10.

A method for preparing the N-type TOPCon cell with double-sided aluminum paste electrodes includes the following processes: texturing→B diffusion→BSG removal→alkali polishing→depositing a tunnel oxide layer and a polysilicon layer on a back side of a substrate by means of LPCVD→PSG removal→plating removal→deposition of an $AlO_x$ preparatory layer and a first $SiN_xH_y$ preparatory layer on a front side of the substrate→deposition of a second $SiN_xH_y$ preparatory layer on the back side of the substrate→UV laser ablation on the front side of the substrate and the back side of the substrate→screen printing. The method specifically includes the following steps.

At step A, namely the step of preparation of an N-type double-sided cell before metallization: an N-type monoc-rystalline silicon wafer as the substrate, the P-type doped region layer is formed on a front side of the N-type monocrystalline silicon wafer successively by means of B diffusion, a $AlO_x$ layer on the front side of the N-type substrate 1 with the thickness of 8 nm and first $SiN_xH_y$ layer on the front side of the N-type substrate 1 with the thickness of 80 nm are deposited by means of PECVD, a tunnel oxide layer on the back side of the N-type substrate 1 with the thickness of 2 mm is deposited on a back side of the N-type silicon wafer by means of LPCVD; and the N-type doped polysilicon layer on the back side of the N-type substrate with a thickness of 150 nm is formed by means of LPCVD and P diffusion; and second $SiN_xH_y$ preparatory layer on the back side of the N-type substrate 1 with a thickness of 75 nm is deposited by means of PECVD.

At step B, UV laser ablation is performed on a front surface of a preparatory cell prepared by a step A to remove part of passivation dielectric film of the $AlO_x$ preparatory layer and an $SiN_xH_y$ preparatory layer; and UV laser ablation is performed on a back side of the cell prepared by the step A to remove part of passivation dielectric film of the second $SiN_xH_y$ preparatory layer. A spot diameter of a UV laser is 20 um, and a space between two adjacent of spots of the UV laser is 350 um; a front-side ablation film-removing depth is consistent with thicknesses of the $AlO_x$ preparatory layer and the first $SiN_xH_y$ preparatory layer 81; and a back-side ablation film-removing depth is consistent with a thickness of the passivation dielectric film of the second $SiN_xH_y$ layer on the back side of the N-type substrate 1.

At step C, aluminum paste (Al 65 wt %, Si 25 wt %, glass powder 5 wt %, and resin 5 wt %; and an organic solvent is added to the aluminum paste adjust viscosity to be 20 Pa·s) is used to print and sinter the front surface of the cell by the step B, so as to form a local contact point H-type front-side aluminum fine grids line electrode, where each of a front-side silver main grids are designed in a first segmented structure, the first segmented structure includes a plurality of first grid segments, and each of a front-side silver main grids is distributed in aluminum fine grid lines; a number of the front-side aluminum fine grids is 112, each of the front-side aluminum fine grids has a the width being 32 um and each of the front-side aluminum fine grids has a height being 18 um; and each of the plurality of first grid segments of the front-side silver main grids has a length of 5 mm, a width of 1 mm and a height of 6 um, and a number of the front-side silver main grids is 8.

At step D, weak burn-through type aluminum paste (Al 65 wt %, Si 25 wt %, glass powder 5 wt %, and resin 5 wt %; and the organic solvent is added to the weak burn-through type aluminum paste adjust the viscosity to be 20 Pa·s) is used to print and sinter a back side of the cell by the step B or step C, so as to form a local contact point H-type back-side aluminum fine grid line electrode, where a number of the back-side aluminum fine grids is 135, each of the back-side aluminum fine grids with the width being 100 um and each of the back-side aluminum fine grids with the height being 18 um; and each of the back-side silver main grids are designed in a second segmented structure, and the second segmented structure includes a plurality of second grid segments; each of the plurality of first grid segments has a length of 5 mm, a width of 1 mm and a height of 5 um, and a number of the back-side silver main grids is 8. The aluminum fine grids formed on the back side by means of sintering forms an ohmic contact with the N-type doped polysilicon layer, without forming a BSF layer.

Embodiment 2

As shown in FIG. 1, an N-type TOPCon cell with double-sided aluminum paste electrodes includes an N-type substrate 1. A P-type doped region layer 6, an $AlO_x$ layer 7 and a first $SiN_xH_y$ layer 81 are successively provided, from inside to outside, on a front side of the N-type substrate 1; a tunnel oxide layer 9, an N-type doped polysilicon layer 10 and a second $SiN_xH_y$ layer 82 are successively provided, from inside to outside, on a back side of the N-type substrate 1; as shown in FIG. 2, front-side silver main grids 2 and front-side aluminum fine grids 3 are provided on the first $SiN_xH_y$ layer 81; and as shown in FIG. 3, back-side silver main grids 4 and back-side aluminum fine grids 5 are provided on the second $SiN_xH_y$ layer 82.

A thickness of each of the front-side silver main grids 2 is less than a thickness of each of the front-side aluminum fine grids 3, and the front-side silver main grids 2 are distributed in the front-side aluminum fine grids 3; and a thickness of each of the back-side silver main grids 4 is less than a thickness of each of the back-side aluminum fine grids 5, and the back-side silver main grids 4 are distributed in the back-side aluminum fine grids 5. First contact grooves are provided on the first $AlO_x$ layer 7 and the first $SiN_xH_y$ layer 81 on the front side of the N-type substrate 1; and second contact grooves are provided on the second $SiN_xH_y$ layer 82 on the back side of the N-type substrate 1. The front-side aluminum fine grids 3 pass through the first contact grooves to form first local contact points 111 with the $AlO_x$ layer 7. The back-side aluminum fine grids 5 pass through the second contact grooves to form second local contact points 112 with the N-type doped polysilicon layer 10.

A method for preparing the N-type TOPCon cell with double-sided aluminum paste electrodes includes the following processes: texturing→B diffusion→BSG removal→alkali polishing→depositing a tunnel oxide layer and N-type doped a polysilicon layer on a back side of a substrate by means of LPCVD→P diffusion on the back side of the substrate→PSG removal→plating removal→deposition of an $AlO_x$ preparatory layer and a first $SiN_xH_y$ preparatory layer on a front side of the substrate→deposition of a second $SiN_xH_y$ preparatory layer on the back side of the substrate→UV laser ablation on the front side of the substrate and the back side of the substrate→screen printing. The method includes the following specific preparation steps.

At step A, namely the step of preparation of an N-type double-sided cell before metallization: an N-type monocrystalline silicon wafer as the substrate, the P-type doped region layer is formed on a front side of the N-type monocrystalline silicon wafer successively by means of B diffusion, a $AlO_x$ preparatory layer on the front side of the N-type substrate 1 with the thickness of 15 nm and first $SiN_xH_y$ layer on the front side of the N-type substrate 1 with the thickness of 50 nm and the thickness of 100 nm are deposited by means of PECVD, a tunnel oxide layer on the back side of the N-type substrate 1 with the thickness of 1 mm is deposited on a back side of the N-type silicon wafer by means of LPCVD; and the N-type doped polysilicon layer on the back side of the N-type substrate with a thickness of 200 nm is formed by means of LPCVD and P diffusion; and the second $SiN_xH_y$ preparatory layer on the back side of the N-type substrate 1 with the thickness of 100 nm is deposited by means of PECVD.

At step B, UV laser ablation is performed on a front surface of a preparatory cell prepared by a step A to remove part of passivation dielectric film of the $AlO_x$ preparatory layer and the first $SiN_xH_y$ preparatory layer; and UV laser ablation is performed on a back side of the cell prepared by the step A to remove part of passivation dielectric film of the second $SiN_xH_y$ layer. A spot diameter of a UV laser is 10 um, and a space between two adjacent of spots of the UV laser is 700 um; a front-side ablation film-removing depth is consistent with thicknesses of the $AlO_x$ preparatory layer and the first $SiN_xH_y$ layer 81; and a back-side ablation film-removing depth is consistent with a thickness of the passivation dielectric film of the second $SiN_xH_y$ layer 82 on the back side of the N-type substrate 1.

At step C, aluminum paste (Al 65 wt %, Si 25 wt %, glass powder 5 wt %, and resin 5 wt %; and an organic solvent is added to the aluminum paste adjust viscosity to be 20 Pa·s) is used to print and sinter the front surface of the cell by the step B, so as to form a local contact point H-type front-side aluminum fine grid line electrode, where each of a front-side silver main grids are designed in a first segmented structure, the first segmented structure includes a plurality of first grid segments, and each of a front-side silver main grids is distributed in aluminum fine grid lines; a number of the front-side aluminum fine grids is 106, each of the front-side aluminum fine grids with the width being 40 um and each of the front-side aluminum fine grids the height being 10 um; and each of the plurality of first grid segments of the front-side silver main grids has a length of 8 mm, a width of 0.1 mm and a height of 8 um, and a number of the front-side silver main grids is 5.

At step D, weak burn-through type aluminum paste (Al 65 wt %, Si 25 wt %, glass powder 5 wt %, and resin 5 wt %; and the organic solvent is added to the weak burn-through type aluminum paste adjust the viscosity to be 20 Pa·s) is used to print and sinter a back side of the cell by the step B or step C, so as to form a local contact point H-type back-side aluminum fine grids line electrode, where a number of the back-side aluminum fine grids is 110, each of the back-side aluminum fine grids width being 160 um and each of the back-side aluminum fine grids the height being 10 um; and the back-side silver main grids are designed in a second segmented structure, and the second segmented structure includes a plurality of second grid segments; each of the plurality of second grid segments has a length of 8 mm, a width of 0.1 mm and a height of 8 um, and a number of the back-side silver main grids is 5. The aluminum fine grid formed on the back side by means of sintering forms an ohmic contact with the N-type doped polysilicon layer, without forming a BSF layer.

Embodiment 3

As shown in FIGS. 1-3, an N-type TOPCon cell with double-sided aluminum paste electrodes includes an N-type substrate 1. A P-type doped region layer 6, an $AlO_x$ layer 7 and a first $SiN_xH_y$ layer 81 are successively provided, from inside to outside, on a front side of the N-type substrate 1; a tunnel oxide layer 9, an N-type doped polysilicon layer 10 and a second $SiN_xH_y$ layer 82 are successively provided, from inside to outside, on a back side of the N-type substrate 1; and front-side silver main grids 2 and front-side aluminum fine grids 3 are provided on the first $SiN_xH_y$ layer 81, and back-side silver main grids 4 and back-side aluminum fine grids 5 are provided on the second $SiN_xH_y$ layer 82.

A thickness of each of the front-side silver main grids 2 is less than a thickness of each of the front-side aluminum fine grids 3, and the front-side silver main grids 2 are distributed in the front-side aluminum fine grids 3; and a thickness of each of the back-side silver main grids 4 is less than a thickness of each of the back-side aluminum fine grids 5, and the back-side silver main grids 4 are distributed in the back-side aluminum fine grids 5. First contact grooves are provided on the $AlO_x$ layer 7 and the first $SiN_xH_y$ layer 81 on the front side of the N-type substrate 1; and second contact grooves are provided on the second SiN$_x$H$_y$ layer 82 on the back side of the N-type substrate 1. The front-side aluminum fine grids 3 pass through the first contact grooves to form first local contact points 111 with the AlO$_x$ layer 7. The back-side aluminum fine grids 5 pass through the second contact grooves to form second local contact points 112 with the N-type doped polysilicon layer 10.

A method for preparing the N-type TOPCon cell with double-sided aluminum paste electrodes includes the following processes: texturing→B diffusion→BSG removal→alkali polishing→depositing a tunnel oxide layer and N-type doped a polysilicon layer on a back side of a substrate by means of LPCVD→P diffusion on the back side of the substrate→PSG removal→plating removal→deposition of an AlO$_x$ preparatory layer and a first SiN$_x$H$_y$ preparatory layer on a front side of the substrate→deposition of a second SiN$_x$H$_y$ preparatory layer on the back side of the substrate→UV laser ablation on the front side of the substrate and the back side of the substrate→screen printing. The method specifically includes the following steps.

At step A, namely the step of preparation of an N-type double-sided cell before metallization: an N-type monocrystalline silicon wafer as the substrate, the P-type doped region layer is formed on a front side of the N-type monocrystalline silicon wafer successively by means of B diffusion, a AlO$_x$ layer on the front side of the N-type substrate 1 with the thickness of 2 nm and first SiN$_x$H$_y$ layer on the front side of the N-type substrate 1 with the thickness of 50 nm are deposited by means of PECVD, a tunnel oxide layer on the back side of the N-type substrate 1 with the thickness of 8 mm is deposited on a back side of the N-type silicon wafer by means of LPCVD; and the N-type doped polysilicon layer on the back side of the N-type substrate with a thickness of 100 nm is formed by means of LPCVD and P diffusion; and the second SiN$_x$H$_y$ preparatory layer on the back side of the N-type substrate 1 with a thickness of 60 nm is deposited by means of PECVD.

At step B, UV laser ablation is performed on a front surface of a preparatory the cell prepared by a step A to remove part of passivation dielectric film of the AlO$_x$ preparatory layer and the first SiN$_x$H$_y$ preparatory layer; and UV laser ablation is performed on a back side of the cell prepared by the step A to remove part of passivation dielectric film of the second SiN$_x$H$_y$ preparatory layer. A spot diameter of a UV laser is 30 um, and a space between two adjacent of spots of the UV laser is 0 um; a front-side ablation film-removing depth is consistent with the thicknesses of the AlO$_x$ preparatory layer and the first SiN$_x$H$_y$ preparatory layer; and a back-side ablation film-removing depth is consistent with a thickness of the passivation dielectric film of the second SiN$_x$H$_y$ layer 82 on the back side of the N-type substrate 1.

At step C, aluminum paste (Al 65 wt %, Si 25 wt %, glass powder 5 wt %, and resin 5 wt %; and an organic solvent is added to the aluminum paste adjust viscosity to be 20 Pa·s) is used to print and sinter the front surface of the cell by the step B, so as to form a local contact point H-type front-side aluminum fine grids line electrode, where each of a front-side silver main grids are designed in a first segmented structure, the first segmented structure includes a plurality of first grid segments, and each of a front-side silver main grids is distributed in aluminum fine grid lines; a number of the front-side aluminum fine grids is 122, each of the front-side aluminum fine grids with the width being 25 um and each of the front-side aluminum fine grids the height being 25 um; and each of the plurality of first grid segments of the front-side silver main grid has a length of 2 mm, a width of 2 mm and a height of 4 um, and a number of the front-side silver main grids is 12.

At step D, weak burn-through type aluminum paste (Al 65 wt %, Si 25 wt %, glass powder 5 wt %, and resin 5 wt %; and the organic solvent is added to the weak burn-through type aluminum paste adjust the viscosity to be 20 Pa·s) is used to print and sinter a back side of the cell by the step B or step C, so as to form a local contact point H-type back-side aluminum fine grid line electrode, where a number of the back-side aluminum fine grids is 160, with each of the back-side aluminum fine grids the width being 40 um and each of the back-side aluminum fine grids with the height being 10 um; and each of the back-side silver main grids are designed in a second grid segmented structure, each of the plurality of second grid segments has a length of 8 mm, a width of 0.1 mm and a height of 8 um, and a number of the back-side silver main grids is 12. The aluminum fine grids formed on the back side by means of sintering forms an ohmic contact with the N-type doped polysilicon layer, without forming a BSF layer.

Embodiment 4

As shown in FIG. 1, an N-type TOPCon cell with double-sided aluminum paste electrodes includes an N-type substrate 1. A P-type doped region layer 6, an AlO$_x$ layer 7 and a first SiN$_x$H$_y$ layer 81 are successively provided, from inside to outside, on a front side of the N-type substrate 1; a tunnel oxide layer 9, an N-type doped polysilicon layer 10 and a second SiN$_x$H$_y$ layer 82 are successively provided, from inside to outside, on a back side of the N-type substrate 1; as shown in FIG. 2, front-side silver main grids 2 and front-side aluminum fine grids 3 are provided on the first SiN$_x$H$_y$ layer 81; and as shown in FIG. 3, back-side silver main grids 4 and back-side aluminum fine grids 5 are provided on the second SiN$_x$H$_y$ layer 82.

A thickness of each of the front-side silver main grids 2 is less than a thickness of each of the front-side aluminum fine grids 3, and the front-side silver main grids 2 are distributed in the front-side aluminum fine grids 3; and a thickness of each of the back-side silver main grids 4 is less than a thickness of each of the back-side aluminum fine grids 5, and the back-side silver main grids 4 are distributed in the back-side aluminum fine grids 5. First contact grooves are provided on the AlO$_x$ layer 7 and the first SiN$_x$H$_y$ layer 81 on the front side of the N-type substrate 1; and second contact groove is provided on the second SiN$_x$H$_y$ layer 82 on the back side of the N-type substrate 1. The front-side aluminum fine grids 3 pass through the first contact grooves to form first local contact points 111 with the AlO$_x$ layer 7. The back-side aluminum fine grids 5 pass through the second contact grooves to form second local contact points 112 with the N-type doped polysilicon layer 10.

A method for preparing the N-type TOPCon cell with double-sided aluminum paste electrodes includes the following processes: texturing→B diffusion→BSG removal→alkali polishing→depositing a tunnel oxide layer and N-type doped a polysilicon layer on a back side of a substrate by means of LPCVD→P diffusion on the back side of the substrate→PSG removal→plating removal→deposition of an AlO$_x$ preparatory layer and a first SiN$_x$H$_y$ preparatory layer on a front side of the substrate→deposition of a second SiN$_x$H$_y$ preparatory layer on the back side of the substrate→UV laser ablation on the front side of the substrate and the back side of the substrate→screen printing. The method specifically includes the following steps.

At step A, namely the step of preparation of an N-type double-sided cell before metallization: an N-type monocrystalline silicon wafer as the substrate, the P-type doped region layer is formed on a front side of the N-type monocrystalline silicon wafer successively by means of B diffusion, the $AlO_x$ preparatory layer on the front side of the N-type substrate 1 with the thickness of 4 nm and first $SiN_xH_y$ preparatory layer on the front side of the N-type substrate 1 with the thickness of 60 nm are deposited by means of PECVD, a tunnel oxide layer on the back side of the N-type substrate 1 with the thickness of 2 mm is deposited on the back side of the N-type silicon wafer by means of LPCVD; and the N-type doped polysilicon layer on the back side of the N-type substrate 1 with the thickness of 120 nm is formed by means of LPCVD and P diffusion; and the second $SiN_xH_y$ preparatory layer on the back side of the N-type substrate 1 with the thickness of 80 nm is deposited by means of PECVD.

At step B, UV laser ablation is performed on a front surface of a preparatory cell prepared by a step A to remove part of passivation dielectric film of the $AlO_x$ preparatory layer and an $SiN_xH_y$ preparatory layer; and UV laser ablation is performed on a back side of the cell prepared by the step A to remove part of passivation dielectric film of the second $SiN_xH_y$ preparatory layer. A spot diameter of a UV laser is 25 um, and a space between two adjacent of spots of the UV laser is 100 um; a front-side ablation film-removing depth is consistent with the thicknesses of the $AlO_x$ preparatory layer and the first $SiN_xH_y$ preparatory layer 81; and a back-side ablation film-removing depth is consistent with a thickness of the passivation dielectric film of the second $SiN_xH_y$ layer on the back side of the N-type substrate 1.

At step C, aluminum paste (Al 65 wt %, Si 25 wt %, glass powder 5 wt %, and resin 5 wt %; and an organic solvent is added to the aluminum paste adjust viscosity to be 20 Pa·s) is used to print and sinter the front surface of the cell by the step B, so as to form a local contact point H-type front-side aluminum fine grid line electrode, where each of a front-side silver main grids are designed in a first segmented structure, the first segmented structure includes a plurality of first grid segments, and each of a front-side silver main grids is distributed in aluminum fine grid lines; a number of the front-side aluminum fine grids is 112, each of the front-side aluminum fine grids with the width being 30 um and each of the front-side aluminum fine grids the height being 20 um; and each segment of the front-side silver main grid has a length of 4 mm, a width of 0.5 mm and a height of 5 um, and a number of the front-side silver main grids is 7.

At step D, weak burn-through type aluminum paste (Al 65 wt %, Si 25 wt %, glass powder 5 wt %, and resin 5 wt %; and the organic solvent is added to the weak burn-through type aluminum paste adjust the viscosity to be 20 Pa·s) is used to print and sinter a back side of the cell by the step B or step C, so as to form a local contact point H-type back-side aluminum fine grids line electrode, where a number of the back-side aluminum fine grids is 125, with each of the back-side aluminum fine grids width being 55 um and each of the back-side aluminum fine grids the height being 15 um; and each of the back-side silver main grids are designed in a second segmented structure, and the second segmented structure includes a plurality of second grid segments; each of the plurality of second grid segments has a length of 4 mm, a width of 0.8 mm and a height of 5 um, and a number of the back-side silver main grids is 7. The aluminum fine grids formed on the back side by means of sintering forms an ohmic contact with the N-type doped polysilicon layer, without forming a BSF layer.

Embodiment 5

As shown in FIG. 1, an N-type TOPCon cell with double-sided aluminum paste electrodes includes an N-type substrate 1. A P-type doped region layer 6, an $AlO_x$ layer 7 and a first $SiN_xH_y$ layer 81 are successively provided, from inside to outside, on a front side of the N-type substrate 1; a tunnel oxide layer 9, an N-type doped polysilicon layer 10 and a second $SiN_xH_y$ layer 82 are successively provided, from inside to outside, on a back side of the N-type substrate 1; as shown in FIG. 2, front-side silver main grids 2 and front-side aluminum fine grids 3 are provided on the first $SiN_xH_y$ layer 81; and as shown in FIG. 3, back-side silver main grids 4 and back-side aluminum fine grids 5 are provided on the second $SiN_xH_y$ layer 82.

A thickness of each of the front-side silver main grids 2 is less than a thickness of each of the front-side aluminum fine grids 3, and the front-side silver main grids 2 are distributed in the front-side aluminum fine grids 3; and a thickness of each of the back-side silver main grids 4 is less than a thickness of each of the back-side aluminum fine grids 5, and the back-side silver main grids 4 are distributed in the back-side aluminum fine grids 5. First contact grooves are provided on the $AlO_x$ layer 7 and the first $SiN_xH_y$ layer 81 on the front side of the N-type substrate 1; and second contact grooves are provided on the second $SiN_xH_y$ layer 82 on the back side of the N-type substrate 1. The front-side aluminum fine grids 3 pass through the first contact grooves to form first local contact points 111 with the $AlO_x$ layer 7. The back-side aluminum fine grids 5 pass through the second contact grooves to form second local contact points 112 with the N-type doped polysilicon layer 10.

A method for preparing the N-type TOPCon cell with double-sided aluminum paste electrodes includes the following processes: texturing→B diffusion→BSG removal→alkali polishing→depositing a tunnel oxide layer and N-type doped a polysilicon layer on a back side of a substrate by means of LPCVD→P diffusion on the back side of the substrate→PSG removal→plating removal→deposition of an $AlO_x$ preparatory layer and a first $SiN_xH_y$ preparatory layer on a front side of the substrate→deposition of a second $SiN_xH_y$ preparatory layer on the back side of the substrate→UV laser ablation on the front side of the substrate and the back side of the substrate→screen printing. The method specifically includes the following steps.

At step A, namely the step of preparation of an N-type double-sided cell before metallization: an N-type monocrystalline silicon wafer as the substrate, the P-type doped region layer is formed on a front side of the N-type monocrystalline silicon wafer successively by means of B diffusion, the $AlO_x$ preparatory layer on the front side of the N-type substrate 1 with the thickness of 12 nm and first $SiN_xH_y$ preparatory layer on the front side of the N-type substrate 1 with the thickness of 90 nm are deposited by means of PECVD, the tunnel oxide layer on the back side of the N-type substrate 1 with the thickness of 3 mm is deposited on the back side of the N-type silicon wafer by means of LPCVD; and the N-type doped polysilicon layer on the back side of the N-type substrate with a thickness of 180 nm is formed by means of LPCVD and P diffusion; and the second $SiN_xH_y$ preparatory layer on the back side of the N-type substrate 1 with the thickness of 90 nm is deposited by means of PECVD.

At step B, UV laser ablation is performed on the front surface of a preparatory cell prepared by a step A to remove part of passivation dielectric film of the $AlO_x$ preparatory layer and an $SiN_xH_y$ preparatory layer; and UV laser ablation is performed on a back side of the cell prepared by the step A to remove part of passivation dielectric film of the second $SiN_xH_y$ preparatory layer. A spot diameter of a UV laser is 15 um, and a space between two adjacent of spots of the UV laser is 650 um; a front-side ablation film-removing depth is consistent with thicknesses of the $AlO_x$ preparatory layer and the first $SiN_xH_y$ preparatory layer; and a back-side ablation film-removing depth is consistent with a thickness of the passivation dielectric film of the second $SiN_xH_y$ layer on the back side of the N-type substrate 1.

At step C, aluminum paste (Al 65 wt %, Si 25 wt %, glass powder 5 wt %, and resin 5 wt %; and an organic solvent is added to the aluminum paste adjust viscosity to be 20 Pa·s) is used to print and sinter the front surface of the cell by the step B, so as to form a local contact point H-type front-side aluminum fine grid line electrode, where each of the front-side silver main grids are designed in a first segmented structure, the first segmented structure includes a plurality of first grid segments, and each of a front-side silver main grids is distributed in aluminum fine grid lines; a number of the front-side aluminum fine grids is 120, each of the front-side aluminum fine grids with the width being 35 um and each of the front-side aluminum fine grids the height being 22 um; and each of the plurality of first grid segments of the front-side silver main grid has a length of 6 mm, a width of 1.6 mm and a height of 6.5 um, and a number of the front-side silver main grids is 10.

At step D, weak burn-through type aluminum paste (Al 65 wt %, Si 25 wt %, glass powder 5 wt %, and resin 5 wt %; and the organic solvent is added to the weak burn-through type aluminum paste adjust the viscosity to be 20 Pa·s) is used to print and sinter a back side of the cell by the step B or step C, so as to form a local contact point H-type back-side aluminum fine grid line electrode, where a number of the back-side aluminum fine grids is 150, each of the back-side aluminum fine grids with the width being 150 um and each of the back-side aluminum fine grids with the height being 15 um; and the back-side silver main grids are designed in a second segmented structure, and the second segmented structure includes a plurality of second grid segments; each of the plurality of second grid segments has a length of 6.5 mm, a width of 1.8 mm and a height of 6 um, and a number of the back-side silver main grids is 10. The aluminum fine grids formed on the back side by means of sintering forms an ohmic contact with the N-type doped polysilicon layer, without forming a BSF layer.

Comparative embodiment 1 (the difference between this comparative example and Embodiment 1 lies in that the front side of the substrate and the back side are not provided with aluminum grids line.)

An N-type TOPCon cell includes an N-type substrate 1. A P-type doped region layer 6, an $AlO_x$ layer 7 and a first $SiN_xH_y$ layer 81 are successively provided, from inside to outside, on a front side of the N-type substrate 1; a tunnel oxide layer 9, an N-type doped polysilicon layer 10 and a second $SiN_xH_y$ layer 82 are successively provided, from inside to outside, on a back side of the N-type substrate 1; and front-side silver main grids 2 is provided on the first $SiN_xH_y$ layer 81, and back-side silver main grids 4 are provided on the second $SiN_xH_y$ layer 82.

A method for preparing the N-type TOPCon cell with double-sided aluminum paste electrodes includes the following processes: texturing→B diffusion→BSG removal→alkali polishing→depositing a tunnel oxide layer and N-type doped a polysilicon layer on a back side of a substrate by means of LPCVD→P diffusion on the back side of a substrate→PSG removal→plating removal→deposition of an $AlO_x$ preparatory layer and a first $SiN_xH_y$ preparatory layer on a front side of the substrate→deposition of a second $SiN_xH_y$ preparatory layer on the back side of the substrate→UV laser ablation on the front side of the substrate and the back side of the substrate→screen printing. The preparation process specifically includes the following steps.

At step A, namely the step of preparation of an N-type double-sided cell before metallization: an N-type monocrystalline silicon wafer as the substrate, the P-type doped region layer is formed on a front side of the N-type monocrystalline silicon wafer successively by means of B diffusion, a $AlO_x$ preparatory layer on the front side of the N-type substrate 1 with the thickness of 8 nm and the first $SiN_xH_y$ preparatory layer on the front side of the N-type substrate 1 with the thickness of 80 nm are deposited by means of PECVD, a tunnel oxide layer on the back side of the N-type substrate 1 with the thickness of 4 mm is deposited on a back side of the N-type silicon wafer by means of LPCVD; and the N-type doped polysilicon layer on the back side of the N-type substrate 1 with a thickness of 150 nm is formed by means of LPCVD and P diffusion; and the second $SiN_xH_y$ preparatory layer on the back side of the N-type substrate 1 with a thickness of 75 nm is deposited by means of PECVD.

At step B, UV laser ablation is performed on a front surface of a preparatory cell prepared by a step A to remove part of passivation dielectric film of the $AlO_x$ preparatory layer and an the first $SiN_xH_y$ preparatory layer; and UV laser ablation is performed on a back side of the cell prepared by the step A to remove part of passivation dielectric film of the second $SiN_xH_y$ preparatory layer.

At step C, aluminum paste is used to print and sinter the front surface of the cell by the step B, so as to form a local contact point H-type front-side aluminum fine grids line electrode, where each of the front-side silver main grids are designed in a first segmented structure, the first segmented structure includes a plurality of first grid segments; and each of the plurality of first grid segments of the front-side silver main grids has a length of 5 mm, each of the plurality of first grid segments of the front-side silver main grids has a width of 1 mm and each of the plurality of first grid segments of the front-side silver main grids has a height of 6 um, and a number of the front-side silver main grids is 8.

At step D, each of the back-side silver main grids are designed in a second segmented structure, and the second segmented structure includes a plurality of second grid segments; and each of the plurality of second grid segments has a length of 5 mm, a width of 1 mm and a height of 5 um, and a number of the front-side silver main grids is 8.

Comparative embodiment 2 (the difference between this comparative embodiment and Embodiment 1 lies in that UV laser ablation is not used on the front side of the cell to remove part of the $AlO_x$ layer and an $SiN_xH_y$ layer passivation dielectric film, and is also not used on the back side of the cell to remove part of the $SiN_xH_y$ layer passivation dielectric film.)

An N-type TOPCon cell includes an N-type substrate 1. A P-type doped region layer 6, an $AlO_x$ layer 7 and a first $SiN_xH_y$ layer 81 are successively provided, from inside to outside, on a front side of the N-type substrate 1; a tunnel oxide layer 9, an N-type doped polysilicon layer 10 and a second $SiN_xH_y$ layer 82 are successively provided, from inside to outside, on a back side of the N-type substrate 1; and front-side silver main grids 2 and front-side aluminum fine grids 3 are provided on the first $SiN_xH_y$ layer 81, and back-side silver main grids 4 and back-side aluminum fine grids 5 are provided on the second $SiN_xH_y$ layer 82.

A thickness of each of the front-side silver main grids 2 is less than a thickness of each of the front-side aluminum fine grids 3, and the front-side silver main grids 2 are distributed in the front-side aluminum fine grids 3; and a thickness of each of the back-side silver main grids 4 is less than a thickness of each of the back-side aluminum fine grids 5, and the back-side silver main grids 4 are distributed in the back-side aluminum fine grids 5. First contact grooves are provided on the $AlO_x$ layer 7 and the first $SiN_xH_y$ layer 8 on the front side of the N-type substrate 1; and second contact grooves are provided on the second $SiN_xH_y$ layer 82 on the back side of the N-type substrate 1. The front-side aluminum fine grids 3 pass through the first contact grooves to form first local contact points 111 with the $AlO_x$ layer 7. The back-side aluminum fine grids 5 pass through the second contact grooves to form second local contact points 112 with the N-type doped polysilicon layer 10.

A method for preparing the N-type TOPCon cell with double-sided aluminum paste electrodes includes the following processes: texturing→B diffusion→BSG removal→alkali polishing→depositing a tunnel oxide layer and N-type doped a polysilicon layer on a back side of a substrate by means of LPCVD→P diffusion on the back side of the substrate→PSG removal→plating removal→deposition of an $AlO_x$ preparatory layer and a first $SiN_xH_y$ preparatory layer on a front side of the substrate→deposition of a second $SiN_xH_y$ preparatory layer on the back side of the substrate→screen printing. The preparation process specifically includes the following steps.

At step A, namely the step of preparation of an N-type double-sided cell before metallization: an N-type monocrystalline silicon wafer is used as the substrate, the P-type doped region layer is formed on a front side of the N-type monocrystalline silicon wafer successively by means of B diffusion, a $AlO_x$ layer on the front side of the N-type substrate 1 with the thickness of 8 nm and first $SiN_xH_y$ layer on the front side of the N-type substrate 1 with the thickness of 80 nm are deposited by means of PECVD, a tunnel oxide layer on the back side of the N-type substrate 1 with the thickness of 4 mm is deposited on the back side of the N-type silicon wafer by means of LPCVD; and the N-type doped polysilicon layer with the thickness of 150 nm is formed by means of LPCVD and P diffusion; and the second $SiN_xH_y$ layer on the back side of the N-type substrate 1 with the a thickness of 75 nm is deposited by means of PECVD.

At step C, each of the front-side silver main grids are designed in a first segmented structure, the first segmented structure includes a plurality of first grid segments, and the front-side silver main grids are distributed in aluminum fine grid lines; a number of the front-side aluminum fine grids is 112, with the width being 32 um and the height being 18 um; and each of the plurality of first grid segments of the front-side silver main grids has a length of 5 mm, a width of 1 mm and a height of 6 um, and a number of the front-side silver main grids is 8.

At step D, a number of the back-side aluminum fine grids is 135, with the width being 100 um and the height being 18 um; the back-side silver main grids are designed in a second segmented structure, and the second segmented structure includes a plurality of second grid segments; and each of the plurality of second grid segments of the back-side silver main grid has a length of 5 mm, a width of 1 mm and a height of 5 um, and a number of the front-side silver main grids is 8.

Comparative embodiment 3 (the difference between this comparative embodiment and Embodiment 1 lies in that UV laser ablation is only used on the front side of the cell to remove part of passivation dielectric film the $SiN_xH_y$ layer.)

An N-type TOPCon cell includes an N-type substrate 1. A P-type doped region layer 6, an $AlO_x$ layer 7 and a first $SiN_xH_y$ layer 81 are successively provided, from inside to outside, on a front side of the N-type substrate 1; a tunnel oxide layer 9, an N-type doped polysilicon layer 10 and a second $SiN_xH_y$ layer 82 are successively provided, from inside to outside, on a back side of the N-type substrate 1; and front-side silver main grids 2 and front-side aluminum fine grids 3 are provided on the first $SiN_xH_y$ layer 81, and back-side silver main grids 4 and back-side aluminum fine grids 5 are provided on the second $SiN_xH_y$ layer 82.

A thickness of each the front-side silver main grids 2 is less than a thickness of each the front-side aluminum fine grids 3, and the front-side silver main grids 2 are distributed in the front-side aluminum fine grids 3; and a thickness of each of the back-side silver main grids 4 is less than a thickness of each of the back-side aluminum fine grids 5, and the back-side silver main grids 4 are distributed in the back-side aluminum fine grids 5. First contact grooves are provided on the $AlO_x$ layer 7 and the first $SiN_xH_y$ layer 8 on the front side of the N-type substrate 1; and second contact grooves are provided on the second $SiN_xH_y$ layer 8 on the back side of the N-type substrate 1. The front-side aluminum fine grids 3 pass through the first contact grooves to form first local contact points 111 with the $AlO_x$ layer 7. The back-side aluminum fine grids 5 pass through the second contact grooves to form second local contact points 112 with the N-type doped polysilicon layer 10.

A method for preparing the N-type TOPCon cell with double-sided aluminum paste electrodes includes the following processes: texturing→B diffusion→BSG removal→alkali polishing→depositing a tunnel oxide layer and N-type doped a polysilicon layer on a back side of a substrate by means of LPCVD→P diffusion on the back side of the substrate→PSG removal→plating removal→deposition of an $AlO_x$ preparatory layer and a first $SiN_xH_y$ preparatory layer on the front side of the substrate→deposition of a second $SiN_xH_y$ preparatory layer on the back side of the substrate→UV laser ablation on the front side of the substrate and the back side of the substrate→screen printing. The preparation process specifically includes the following steps.

At step A, namely the step of preparation of an N-type double-sided cell before metallization: an N-type monocrystalline silicon wafer is used as the substrate, the P-type doped region layer is formed on a front side of the N-type monocrystalline silicon wafer successively by means of B diffusion, a $AlO_x$ layer on the front side of the N-type substrate 1 with the thickness of 8 nm and first $SiN_xH_y$ layer on the front side of the N-type substrate 1 with the thickness of 80 nm are deposited by means of PECVD, a tunnel oxide layer on the back side of the N-type substrate 1 with the thickness of 4 mm is deposited on the back side of the N-type silicon wafer by means of LPCVD; and the N-type doped polysilicon layer with the thickness of 150 nm is formed by means of LPCVD and P diffusion; and the second $SiN_xH_y$ layer on the back side of the N-type substrate 1 with the a thickness of 75 nm is deposited by means of PECVD.

At step B, UV laser ablation is performed on a front surface of a preparatory cell prepared by a step A to remove part of passivation dielectric film of a $SiN_xH_y$ layer; and UV laser ablation is performed on a back side of the cell to remove part of passivation dielectric film of the $SiN_xH_y$ layer. A spot diameter of a UV laser is 20 um, and space between two adjacent of spots of the UV laser is 350 um; a front-side ablation film-removing depth is consistent with thickness of the $SiN_xH_y$ layer; and a back-side ablation film-removing depth is consistent with a thickness of the passivation dielectric film of the second $SiN_xH_y$ layer on the back side of the N-type substrate 1.

At step C, aluminum paste is used to print and sinter the front surface of the cell, so as to form a local contact point H-type front-side aluminum fine grids line electrode, where each of the front-side silver main grids are designed in a first segmented structure, the first segmented structure includes a plurality of first grid segments, and the front-side silver main grids are distributed in aluminum fine grid lines; a number of the front-side aluminum fine grids is 112, each of the front-side aluminum fine grids with the width being 32 um and the height being 18 um; and each first grid segments of the front-side silver main grid has a length of 5 mm, a width of 1 mm and a height of 6 um, and the number of the front-side silver main grids is 8.

At step D, weak burn-through type aluminum paste is used to print and sinter the back side of the cell, so as to form a local contact point H-type back-side aluminum fine grids line electrode, where a number of the back-side aluminum fine grids is 135, with the width being 100 um and the height being 18 um; and the back-side silver main grids are designed in a second segmented structure, and the second segmented structure includes a plurality of second grid segments; each of the plurality of second grid segments has a length of 5 mm, a width of 1 mm and a height of 5 um, and a number of the back-side silver main grids is 8. The aluminum fine grid formed on the back side by means of sintering forms an ohmic contact with the N-type doped polysilicon layer, without forming a BSF layer.

Comparative embodiment 4 (the difference between this comparative embodiment and Embodiment 1 lies in that, the UV laser is replaced with a green-light laser.)

An N-type TOPCon cell includes an N-type substrate 1. A P-type doped region layer 6, an $AlO_x$ layer 7 and a first $SiN_xH_y$ layer 81 are successively provided, from inside to outside, on a front side of the N-type substrate 1; a tunnel oxide layer 9, an N-type doped polysilicon layer 10 and a second $SiN_xH_y$ layer 82 are successively provided, from inside to outside, on a back side of the N-type substrate 1; and front-side silver main grids 2 and front-side aluminum fine grids 3 are provided on the first $SiN_xH_y$ layer 81, and back-side silver main grids 4 and back-side aluminum fine grids 5 are provided on the second $SiN_xH_y$ layer 82.

A thickness of each the front-side silver main grids 2 is less than a thickness of each the front-side aluminum fine grids 3, and the front-side silver main grids 2 are distributed in the front-side aluminum fine grids 3; and a thickness of each of the back-side silver main grids 4 is less than a thickness of each of the back-side aluminum fine grids 5, and the back-side silver main grids 4 are distributed in the back-side aluminum fine grids 5. First contact grooves are provided on the first $AlO_x$ layer 7 and the first $SiN_xH_y$ layer 8 on the front side of the N-type substrate 1; and second contact grooves are provided on the second $SiN_xH_y$ layer 8 on the back side of the N-type substrate 1. The front-side aluminum fine grids 3 pass through the first contact grooves to form first local contact points 111 with the $AlO_x$ layer 7. The back-side aluminum fine grids 5 pass through the second contact grooves to form second local contact points 112 with the N-type doped polysilicon layer 10.

A method for preparing the N-type TOPCon cell with double-sided aluminum paste electrodes includes the following processes: texturing→B diffusion→BSG removal→alkali polishing→depositing a tunnel oxide layer and N-type doped a polysilicon layer on a back side of a substrate by means of LPCVD→P diffusion on the back side of the substrate→PSG removal→plating removal→deposition of an $AlO_x$ preparatory layer and a first $SiN_xH_y$ preparatory layer on a front side of the substrate→deposition of a second $SiN_xH_y$ preparatory layer on the back side of the substrate→green-light laser ablation on the front side of the substrate and the back side of the substrate→screen printing. The preparation process specifically includes the following steps.

At step A, namely the step of preparation of an N-type double-sided cell before metallization: an N-type monocrystalline silicon wafer as the substrate, the P-type doped region layer is formed on a front side of the N-type monocrystalline silicon wafer successively by means of B diffusion, a $AlO_x$ preparatory layer on the front side of the N-type substrate 1 with the thickness of 8 nm and first $SiN_xH_y$ preparatory layer on the front side of the N-type substrate 1 with the thickness of 80 nm are deposited by means of PECVD, a tunnel oxide layer on the back side of the N-type substrate 1 with the thickness of 4 mm is deposited on the back side of the N-type silicon wafer successively by means of LPCVD; the N-type doped polysilicon layer with the thickness of 150 nm is formed by means of LPCVD and P diffusion; and the second $SiN_xH_y$ layer on the back side of the N-type substrate 1 with the a thickness of 75 nm is deposited by means of PECVD.

At step B, UV laser ablation is performed on a front surface of a preparatory the cell prepared by a step A to remove part of passivation dielectric film of the $AlO_x$ preparatory layer and an $SiN_xH_y$ preparatory layer; and green-light laser ablation is performed on a back side of the cell prepared by the step A to remove part of passivation dielectric film of the second $SiN_xH_y$ preparatory layer. A spot diameter of a green-light laser is 20 um, and a space s between two adjacent of spots of the green-light laser is 350 um; a front-side ablation film-removing depth is consistent with thicknesses of the $AlO_x$ layer and the first $SiN_xH_y$ layer; and a back-side ablation film-removing depth is consistent with a thickness of the passivation dielectric film of the second $SiN_xH_y$ layer on the back side of the N-type substrate 1.

At step C, aluminum paste is used to print and sinter the front surface of the cell by the step B, so as to form a local contact point H-type front-side aluminum fine grids line electrode, where each of the front-side silver main grids are designed in a first segmented structure, the first segmented structure includes a plurality of first grid segments, and each of a front-side silver main grids is distributed in aluminum fine grid lines; the number of the front-side aluminum fine grids is 112, each of the front-side aluminum fine grids with the width being 32 um and each of the front-side aluminum fine grids with the height being 18 um; and each of the plurality of first grid segments of the front-side silver main grids has a length of 5 mm, a width of 1 mm and a height of 6 um, and a number of the front-side silver main grids is 8.

At step D, weak burn-through type aluminum paste is used to print and sinter a back side of the cell by the step B or step C, so as to form a local contact point H-type back-side aluminum fine grids line electrode, where a number of the back-side aluminum fine grids is 135, each of the back-side aluminum fine grids with the width being 100 um and each of the back-side aluminum fine grids the height being 18 um; and a back-side silver main grids are designed in a second segmented structure, and the second segmented structure includes a plurality of second grid segments; each of the plurality of second grid segments has a length of 5 mm, a width of 1 mm and a height of 5 um, and a number of the back-side silver main grids is 8. The aluminum fine grid formed on the back side by means of sintering forms an ohmic contact with the N-type doped polysilicon layer, without forming a BSF layer.

Comparative embodiment 5 (the difference between this comparative embodiment and Embodiment 1 lies in that, the number of the front-side aluminum fine grids is too few, which is only 60.)

An N-type TOPCon cell includes an N-type substrate 1. A P-type doped region layer 6, an $AlO_x$ layer 7 and a first $SiN_xH_y$ layer 81 are successively provided, from inside to outside, on a front side of the N-type substrate 1; a tunnel oxide layer 9, an N-type doped polysilicon layer 10 and a second $SiN_xH_y$ layer 82 are successively provided, from inside to outside, on a back side of the N-type substrate 1; and front-side silver main grids 2 and front-side aluminum fine grids 3 are provided on the first $SiN_xH_y$ layer 81, and back-side silver main grids 4 and back-side aluminum fine grids 5 are provided on the second $SiN_xH_y$ layer 82.

A thickness of each the front-side silver main grids 2 is less than a thickness of each the front-side aluminum fine grids 3, and the front-side silver main grids 2 are distributed in the front-side aluminum fine grids 3; and a thickness of each the back-side silver main grids 4 is less than a thickness of each the back-side aluminum fine grids 5, and the back-side silver main grids 4 are distributed in the back-side aluminum fine grids 5. First contact grooves are provided on the $AlO_x$ layer 7 and the first $SiN_xH_y$ layer 81 on the front side of the N-type substrate 1; and second contact grooves are provided on the second $SiN_xH_y$ layer 82. The front-side aluminum fine grids 3 pass through the first contact grooves to form first local contact points 111 with the $AlO_x$ layer 7. The back-side aluminum fine grids 5 pass through the second contact grooves to form second local contact points 112 with the N-type doped polysilicon layer 10.

A process for preparing the N-type TOPCon cell includes: texturing→B diffusion→BSG removal→alkali polishing→depositing a tunnel oxide layer and N-type doped a polysilicon layer on a back side of a substrate by means of LPCVD→P diffusion on the back side of the substrate→PSG removal→plating removal→deposition of an $AlO_x$ preparatory layer and a first $SiN_xH_y$ preparatory layer on the front side of the substrate→deposition of a second $SiN_xH_y$ preparatory layer on the back side of the substrate→UV laser ablation on the front side of the substrate and the back side of the substrate→screen printing. The preparation process specifically includes the following steps.

At step A, namely the step of preparation of an N-type double-sided cell before metallization: an N-type monocrystalline silicon wafer as the substrate, the P-type doped region layer is formed on a front side of the N-type monocrystalline silicon wafer successively by means of B diffusion, a $AlO_x$ preparatory layer on the front side of the N-type substrate 1 with the thickness of 8 nm and the first $SiN_xH_y$ preparatory layer with the thickness of 80 nm are deposited by means of PECVD, a tunnel oxide layer on the back side of the N-type substrate 1 with the thickness of 4 mm is deposited on the back side of the N-type silicon wafer by means of LPCVD; and the N-type doped polysilicon layer with the thickness of 150 nm is formed by means of LPCVD and P diffusion; and the second $SiN_xH_y$ layer on the back side of the N-type substrate 1 with the a thickness of 75 nm is deposited by means of PECVD.

At step B, UV laser ablation is performed on a front surface of a preparatory the cell prepared by a step A to remove part of passivation dielectric film of the $AlO_x$ preparatory layer and the first $SiN_xH_y$ preparatory layer; and UV laser ablation is performed on a back side of the cell prepared by the step A to remove part of passivation dielectric film of the second $SiN_xH_y$ preparatory layer. A spot diameter of a UV laser is 20 um, and a space between two adjacent of spots of the UV laser is 350 um; a front-side ablation film-removing depth is consistent with thicknesses of the $AlO_x$ preparatory layer and the first $SiN_xH_y$ preparatory layer; and a back-side ablation film-removing depth is consistent with a thickness of the passivation dielectric film of the second $SiN_xH_y$ layer on the back side of the N-type substrate 1.

At step C, aluminum paste is used to print and sinter the front surface of the cell by the step B, so as to form a local contact point H-type front-side aluminum fine grids line electrode, where each of the front-side silver main grids are designed in a first segmented structure, the first segmented structure includes a plurality of first grid segments, and the front-side silver main grids are distributed in aluminum fine grid lines; a number of the front-side aluminum fine grids is 60, with the width being 32 um and the height being 18 um; and each of the plurality of first grid segments of the front-side silver main grid has a length of 5 mm, a width of 1 mm and a height of 6 um, and a number of the front-side silver main grids is 8.

At step D, weak burn-through type aluminum paste is used to print and sinter a back side of the cell by the step B or step C, so as to form a local contact point H-type back-side aluminum fine grids line electrode, where a number of the back-side aluminum fine grids is 135, each of the back-side aluminum fine grids with the width being 100 um and the height being 18 um; and each of the back-side silver main grids are designed in a second segmented structure, and the second segmented structure includes a plurality of second grid segments; each of the plurality of second grid segments has a length of 5 mm, a width of 1 mm and a height of 5 um, and a number of the back-side silver main grids is 8. The aluminum fine grid formed on the back side by means of sintering forms an ohmic contact with the N-type doped polysilicon layer, without forming a BSF layer.

Comparative embodiment 6 (the difference between this comparative embodiment and Embodiment 1 lies in that, the number of the front-side aluminum fine grids is too many, which is 140.)

An N-type TOPCon cell includes an N-type substrate 1. A P-type doped region layer 6, an $AlO_x$ layer 7 and a first $SiN_xH_y$ layer 81 are successively provided, from inside to outside, on a front side of the N-type substrate 1; a tunnel oxide layer 9, an N-type doped polysilicon layer 10 and a second $SiN_xH_y$ layer 82 are successively provided, from inside to outside, on a back side of the N-type substrate 1; and front-side silver main grids 2 and front-side aluminum fine grids 3 are provided on the first $SiN_xH_y$ layer 81, and back-side silver main grids 4 and back-side aluminum fine grids 5 are provided on the second $SiN_xH_y$ layer 82.

A thickness of each of the front-side silver main grids 2 is less than a thickness of each of the front-side aluminum fine grids 3, and the front-side silver main grids 2 are distributed in the front-side aluminum fine grids 3; and a thickness of each of the back-side silver main grids 4 is less than a thickness of each the back-side aluminum fine grids 5, and the back-side silver main grids 4 are distributed in the back-side aluminum fine grids 5. First contact grooves are provided on the $AlO_x$ layer 7 and the first $SiN_xH_y$ layer 8 on the front side of the N-type substrate 1; and second contact grooves are provided on the second $SiN_xH_y$ layer 8 on the back side of the N-type substrate 1. The front-side aluminum fine grids 3 pass through the first contact grooves to form first local contact points 111 with the $AlO_x$ layer 7. The back-side aluminum fine grids 5 pass through the second contact grooves to form second local contact points 112 with the N-type doped polysilicon layer 10.

A method for preparing the N-type TOPCon cell with double-sided aluminum paste electrodes includes the following processes: texturing→B diffusion→BSG removal→alkali polishing→depositing a tunnel oxide layer and N-type doped a polysilicon layer on a back side of a substrate by means of LPCVD→P diffusion on the back side of the substrate→PSG removal→plating removal→deposition of an $AlO_x$ preparatory layer and a first $SiN_xH_y$ preparatory layer on a front side of the substrate→deposition of a second $SiN_xH_y$ preparatory layer on the back side of the substrate→UV laser ablation on the front side of the substrate and the back side of the substrate→screen printing. The method includes the following specific preparation steps.

At step A, namely the step of preparation of an N-type double-sided cell before metallization: an N-type monocrystalline silicon wafer is used as the substrate, the P-type doped region layer is formed on a front side of the N-type monocrystalline silicon wafer successively by means of B diffusion, a $AlO_x$ preparatory layer on the front side of the N-type substrate 1 with the thickness of 8 nm and the first $SiN_xH_y$ preparatory layer with the thickness of 80 nm are deposited by means of PECVD, a tunnel oxide layer on the back side of the N-type substrate 1 with the thickness of 4 mm is deposited on the back side of the N-type silicon wafer by means of LPCVD; and the N-type doped polysilicon layer with the thickness of 150 nm is formed by means of LPCVD and P diffusion; and the second $SiN_xH_y$ layer on the back side of the N-type substrate 1 with the a thickness of 75 nm is deposited by means of PECVD.

At step B, UV laser ablation is performed on a front surface of a preparatory cell prepared by a step A to remove part of passivation dielectric film of the $AlO_x$ preparatory layer and the first $SiN_xH_y$ preparatory layer; and UV laser ablation is performed on a back side of the cell prepared by the step A to remove part of passivation dielectric film of the second $SiN_xH_y$ preparatory layer. A spot diameter of a UV laser is 20 um, and a space between two adjacent of spots of the UV laser is 350 um; a front-side ablation film-removing depth is consistent with thicknesses of the $AlO_x$ preparatory layer and the first $SiN_xH_y$ preparatory layer; and a back-side ablation film-removing depth is consistent with a thickness of the passivation dielectric film of the second $SiN_xH_y$ layer on the back side of the N-type substrate 1.

At step C, aluminum paste is used to print and sinter the front surface of the cell by the step B, so as to form a local contact point H-type front-side aluminum fine grid line electrode, where the front-side silver main grids are designed in a first segmented structure, the first segmented structure includes a plurality of first grid segments, and each of a front-side silver main grids is distributed in aluminum fine grid lines; a number of the front-side aluminum fine grids is 140, each of the front-side aluminum fine grids with the width being 32 um and the height being 18 um; and each of the plurality of first grid segments of the front-side silver main grid has a length of 5 mm, a width of 1 mm and a height of 6 um, and a number of the front-side silver main grids is 8.

At step D, weak burn-through type aluminum paste is used to print and sinter the back side of the cell by the step B or step C, so as to form a local contact point H-type back-side aluminum fine grid line electrode, where a number of the back-side aluminum fine grids is 135, with each of the back-side aluminum fine grids has a width being 100 um and the height being 18 um; and each of the back-side silver main grids are designed in a second segmented structure, and the second segmented structure includes a plurality of second grid segments; each of the plurality of second grid segments has a length of 5 mm, a width of 1 mm and a height of 5 um, and a number of the back-side silver main grids is 8. The aluminum fine grid formed on the back side by means of sintering forms an ohmic contact with the N-type doped polysilicon layer, without forming a BSF layer.

TABLE 1

Performance parameters of a cell in embodiments and comparative embodiments

| Item | Performance | | | |
|---|---|---|---|---|
| | Relative value of battery efficiency | Relative value of open-circuit voltage | Relative value of current density | Relative value of fill factor |
| Embodiment 1 | 23.61 | 705 | 40.55 | 82.60 |
| Embodiment 2 | 23.23 | 720 | 41.22 | 78.30 |
| Embodiment 3 | 23.54 | 696 | 40.50 | 83.54 |
| Embodiment 4 | 23.42 | 702 | 40.40 | 82.60 |
| Embodiment 5 | 23.37 | 700 | 40.45 | 82.55 |
| Comparative embodiment 1 | 23.45 | 695 | 40.85 | 82.60 |
| Comparative embodiment 2 | 23.29 | 698 | 40.30 | 82.80 |
| Comparative embodiment 3 | 23.42 | 701 | 40.40 | 82.70 |
| Comparative embodiment 4 | 23.13 | 692 | 40.35 | 82.85 |
| Comparative embodiment 5 | 23.04 | 710 | 41.50 | 78.20 |
| Comparative embodiment 6 | 23.26 | 690 | 40.10 | 84.10 |

Conclusion analysis: it can be seen, by synthesizing results in Embodiments 1-5, that a cell can only have higher cell efficiency and current density, and higher sunlight conversion efficiency by using an N-type TOPCon cell structure prepared by the method for preparing the N-type TOPCon cell of the present invention, such that a loss rate of sunlight is greatly reduced, and a manufacturing cost of the cell is greatly saved.

The difference between Comparative embodiment 1 and Embodiment 1 lies in that, front-side silver main grids are provided on a front side of the N-type substrate 1, and there is not front-side aluminum fine grids on the front side of the N-type substrate 1; back-side silver main grids are provided on a back side of the N-type substrate 1, and there is not back-side aluminum fine grids on the back side of the N-type substrate 1. A silver grids have a low light-shading ratio, such that the current density is increased; however, metal compounding is increased at the same time in Comparative embodiment 1, and an open-circuit voltage is obviously reduced, such that corresponding performance of the N-type TOPCon cell is decreased relative to Embodiment 1.

The difference between Comparative embodiment 2 and Embodiment 1 lies in that, the UV laser is not used on a front side of the N-type substrate 1 and a back side of the N-type substrate 1 for film opening. The aluminum paste needs to be corroded by means of a vitreous body of its own, resulting in excessive damage to the passivation film, and both the open-circuit voltage and the current density are reduced, such that the corresponding performance of the N-type TOPCon cell is decreased relative to Embodiment 1.

The difference between Comparative embodiment 3 and Embodiment 1 lies in that, the UV laser is only used on a front side of the N-type substrate 1 for film opening. The aluminum paste on a back side of the N-type substrate 1 needs to be corroded by means of a vitreous body of its own, resulting in excessive damage of a passivation dielectric film of the back-side of the N-type substrate 1, and both a open-circuit voltage and a current density are reduced, such that the corresponding performance of the N-type TOPCon cell is decreased relative to Embodiment 1.

The difference between Comparative embodiment 4 and Embodiment 1 lies in that, the UV laser is replaced with the green-light laser. The green-light laser has stronger penetration power and generates a larger heat-affected zone to a film layer during ablation, the film layer is part of passivation dielectric film of the $AlO_x$ preparatory layer, the first $SiN_xH_y$ preparatory layer and the second $SiN_xH_y$ preparatory layer; and both the open-circuit voltage and the current density are obviously reduced, such that the corresponding performance of the N-type TOPCon cell is decreased relative to Embodiment 1.

The difference between Comparative embodiment 5 and Embodiment 1 lies in that, a number of a front-side aluminum grids is too few, which is only 60, and the fill factor is obviously reduced, such that the corresponding performance of the N-type TOPCon cell is decreased relative to Embodiment 1.

The difference between Comparative embodiment 6 and Embodiment 1 lies in that, a number of the front-side aluminum grids is too many, which is 140; both the open-circuit voltage and the current density are obviously reduced; and although the fill factor is obviously increased, the corresponding performance of the N-type TOPCon cell is eventually decreased relative to Embodiment 1.

It can be learned, from Embodiments 1-5 and Comparative embodiments 1-6, that only a solution within the scope of the claims of the present disclosure can meet the above requirements in all respects, resulting in an optimized solution and an N-type TOPCon cell with double-sided aluminum paste electrodes with optimal performance. However, replacement/addition or subtraction of each deposition layer, or changes in preparation sequence, will have a corresponding negative impact.

The raw materials and devices used in the present disclosure, if not specifically stated, are common raw materials and devices in the art; and the methods used in the present invention, if not specifically stated, are conventional methods in the art.

The above are only preferred embodiments of the present invention, not any limitation to the present invention. Any simple modification, change and equivalent transformation of the above embodiments according to the technical substance of the present disclosure all still fall within the scope of protection of the technical solution of the present invention.

What is claimed is:

1. A preparation method for preparing an N-type TOPCon cell with double-sided aluminum paste electrodes, wherein an N-type TOPCon cell comprises an N-type substrate; a P-type doped region layer, an $AlO_x$ layer and a first $SiN_xH_y$ layer are successively provided, from inside to outside, on a front side of the N-type substrate; a tunnel oxide layer, an N-type doped polysilicon layer and a second $SiN_xH_y$ layer are successively provided, from inside to outside, on a back side of the N-type substrate; front-side silver main grids and front-side aluminum fine grids are provided on the first $SiN_xH_y$ layer, and back-side silver main grids and back-side aluminum fine grids are provided on the second $SiN_xH_y$ layer;

wherein the method for preparing the N-type TOPCon cell with double-sided aluminum paste electrodes comprises:

texturing→B diffusion→BSG removal→alkali polishing→depositing a tunnel oxide layer and a polysilicon layer on a back side of a substrate by means of LPCVD→P diffusion on the back side of the substrate→PSG removal→plating removal→deposition of an $AlO_x$ preparatory layer and a first $SiN_xH_y$ preparatory layer on a front side of the substrate→deposition of a second $SiN_xH_y$ preparatory layer on the back side of the substrate→UV laser ablation on the front side of the substrate and the back side of the substrate→screen printing;

wherein the method for preparing the N-type TOPCon cell with double-sided aluminum paste electrodes comprises the following steps:

A, preparation of an N-type double-sided cell before metallization: using an N-type monocrystalline silicon wafer as the substrate, forming the P-type doped region layer on a front side of the N-type monocrystalline silicon wafer successively by means of B diffusion, depositing the $AlO_x$ preparatory layer and the first $SiN_xH_y$ preparatory layer by means of PECVD, successively depositing the tunnel oxide layer and the polysilicon layer on a back side of the N-type monocrystalline silicon wafer by means of LPCVD, forming the N-type doped polysilicon layer by means of P diffusion, and depositing the second $SiN_xH_y$ preparatory layer by means of PECVD;

B, performing UV laser ablation on a front surface of a preparatory cell prepared by a step A to remove part of passivation dielectric film of the $AlO_x$ preparatory layer and the first $SiN_xH_y$ preparatory layer; and performing UV laser ablation on a back side of the cell prepared by the step A to remove part of passivation dielectric film of the second $SiN_xH_y$ preparatory layer;

C, using aluminum paste to print and sinter a front surface of a preparatory cell prepared by a step B, so as to form a local contact point H-type front-side aluminum fine grid line electrode, wherein each of the front-side silver main grids is designed in a first segmented structure, the first segmented structure comprises a plurality of first g-id-grid segments, and the front-side silver main grids are distributed in aluminum fine grid lines; a number of the front-side aluminum fine grids is 106-122, each of the front-side aluminum fine grids has a width being 25-40 um and a height being 10-25 um; and each of the plurality of first grid segments of the front-side silver main grids has a length of 2-8 mm, a width of 0.1-2 mm and a height of 4-8 um, and a number of the front-side silver main grids is 5-12; and D, using weak burn-through type aluminum paste to print and sinter the back side of the preparatory cell prepared by the step B or the step C, so as to form a local contact point H-type back-side aluminum fine grid line electrode, wherein a number of the back-side aluminum fine grids is 110-160, each of the back-side aluminum fine grids has a width being 40-160 um and a height being 10-25 um; and each of the back-side silver main grids are designed in a second segmented structure, and the second segmented structure comprises a plurality of second grid segments; each of the plurality of second segmented structure grid segments has a length of 2-8 mm, a width of 0.1-2 mm and a height of 4-8 um, and a number of the back-side silver main grids is 5-12.

2. The preparation method for preparing the N-type TOPCon cell with double-sided aluminum paste electrodes as claimed in claim 1, wherein a thickness of the $AlO_x$ preparatory layer on the front side of the N-type substrate is 2-15 nm; a thickness of the first $SiN_xH_y$ preparatory layer on the front side of the N-type substrate is 50-100 nm; a thickness of the tunnel oxide layer on the back side of the N-type substrate is 1-8 nm; a thickness of the N-type doped polysilicon layer on the back side of the N-type substrate is 100-200 nm; and a thickness of the second $SiN_xH_y$ preparatory layer on the back side of the N-type substrate is 50-100 nm.

3. The preparation method for preparing the N-type TOPCon cell with double-sided aluminum paste electrodes as claimed in claim 1, wherein, in step B, a spot diameter of a UV laser is 10-30 um, and a space between two adjacent spots of the UV laser is 0-700 um; a front-side ablation film-removing depth is equal with thicknesses of the $AlO_x$ preparatory layer and the first $SiN_xH_y$ preparatory layer; and a back-side ablation film-removing depth is equal with a thickness of the passivation dielectric film of the second $SiN_xH_y$ layer on the back side of the N-type substrate.

4. The method for preparing the N-type TOPCon cell with double-sided aluminum paste electrodes as claimed in claim 1, wherein the back-side aluminum fine grids and the N-type doped polysilicon layer form an ohmic contact.

5. The preparation method for preparing the N-type TOPCon cell with double-sided aluminum paste electrodes as claimed in claim 1, wherein, in step A, a $AlO_x$ preparatory layer on the front side of the N-type substrate with the thickness of 8 nm and first $SiN_xH_y$ preparatory layer on the front side of the N-type substrate with the thickness of 80 nm are deposited by means of PECVD.

6. The preparation method for preparing the N-type TOPCon cell with double-sided aluminum paste electrodes as claimed in claim 1, wherein, in step A, a tunnel oxide layer on the back side of the N-type substrate with the thickness of 2 mm is deposited on a back side of the N-type silicon wafer successively by means of LPCVD; the N-type doped polysilicon layer on the back side of the N-type substrate with a thickness of 150 nm is formed by means of LPCVD and P diffusion; and second $SiN_xH_y$ layer on the back side of the N-type substrate with a thickness of 75 nm is deposited by means of PECVD.

7. The preparation method for preparing the N-type TOPCon cell with double-sided aluminum paste electrodes as claimed in claim 1, wherein, in step C, the number of the front-side aluminum fine grids is 112, each of the front-side aluminum fine grids with the width being 32 um and each of the front-side aluminum fine grids the height being 18 um; and each segment of the front-side silver main grid has a length of 5 mm, a width of 1 mm and a height of 6 um, and the number of the front-side silver main grids is 8.

8. The preparation method for preparing the N-type TOPCon cell with double-sided aluminum paste electrodes as claimed in claim 1, wherein, in step D, a number of the back-side aluminum fine grids are 135, each of the back-side aluminum fine grids with the width being 100 um and each of the back-side aluminum fine grids with the height being 18 um; and the back-side silver main grids are designed in a segmented structure, each of the plurality of first grids segment has a length of 5 mm, a width of 1 mm and a height of 5 um, and a number of the back-side silver main grids are 8.

9. An N-type TOPCon cell with double-sided aluminum paste electrodes and prepared by the preparation method as claimed in claim 1, wherein a thickness of each of the front-side silver main grids is less than a thickness of each of the front-side aluminum fine grids, and the front-side silver main grids are distributed in the front-side aluminum fine grids; and a thickness of each of the back-side silver main grids is less than a thickness of each of the back-side aluminum fine grids, and the back-side silver main grids are distributed in the back-side aluminum fine grids;
 a number of the front-side aluminum fine grids is 106-122, each of the front-side aluminum fine grids has a width being 25-40 um and a height being 10-25 um; and each of the plurality of first grid segments of the front-side silver main grids has a length of 2-8 mm, a width of 0.1-2 mm and a height of 4-8 um, and a number of the front-side silver main grids is 5-12;
 a number of the back-side aluminum fine grids is 110-160, each of the back-side aluminum fine grids has a width being 40-160 um and a height being 10-25 um; and each of the back-side silver main grids are designed in a second segmented structure, and the second segmented structure comprises a plurality of second grid segments; each of the plurality of second grid segments has a length of 2-8 mm, a width of 0.1-2 mm and a height of 4-8 um, and a number of the back-side silver main grids is 5-12.

10. The N-type TOPCon cell as claimed in claim 9, wherein first contact grooves are provided on the $AlO_x$ layer and the first $SiN_xH_y$ layer on the front side of the N-type substrate; and second contact grooves are provided on the second $SiN_xH_y$ layer on the back side of the N-type substrate.

11. The N-type TOPCon cell as claimed in claim 10, wherein the back-side aluminum fine grids pass through the second contact grooves to form second local contact points with the N-type doped polysilicon layer.

12. The N-type TOPCon cell as claimed in claim 9, wherein a thickness of the $AlO_x$ preparatory layer on the front side of the N-type substrate is 2-15 nm; a thickness of the first $SiN_xH_y$ preparatory layer on the front side of the N-type substrate is 50-100 nm; a thickness of the tunnel oxide layer on the back side of the N-type substrate is 1-8 nm; a thickness of the N-type doped polysilicon layer on the back side of the N-type substrate is 100-200 nm; and a thickness of the second $SiN_xH_y$ preparatory layer on the back side of the N-type substrate is 50-100 nm.

13. The N-type TOPCon cell as claimed in claim 9, wherein in step B of the preparation method for prepping the N-type TOPCon cell with double-sided aluminum paste electrodes, a spot diameter of a UV laser is 10-30 um, and a space between two adjacent spots of the UV laser is 0-700 um; a front-side ablation film-removing depth is equal with thicknesses of the $AlO_x$ preparatory layer and the first $SiN_xH_y$ preparatory layer; and a back-side ablation film-removing depth is equal with a thickness of the passivation dielectric film of the second $SiN_xH_y$ layer on the back side of the N-type substrate.

14. The N-type TOPCon cell as claimed in claim 9, wherein the back-side aluminum fine grids and the N-type doped polysilicon layer form an ohmic contact.

* * * * *